US012660477B2

(12) United States Patent
Yang et al.

(10) Patent No.: US 12,660,477 B2
(45) Date of Patent: Jun. 16, 2026

(54) DISPLAY PANEL AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Yang Yang, Beijing (CN); Mengyuan Pang, Beijing (CN); Junshan Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 493 days.

(21) Appl. No.: 18/025,917

(22) PCT Filed: May 20, 2022

(86) PCT No.: PCT/CN2022/094240
§ 371 (c)(1),
(2) Date: Mar. 13, 2023

(87) PCT Pub. No.: WO2023/221127
PCT Pub. Date: Nov. 23, 2023

(65) Prior Publication Data
US 2024/0292709 A1 Aug. 29, 2024

(51) Int. Cl.
*H10K 59/80* (2023.01)
*H10K 77/10* (2023.01)
*H10K 102/00* (2023.01)

(52) U.S. Cl.
CPC ......... *H10K 59/871* (2023.02); *H10K 59/873* (2023.02); *H10K 77/111* (2023.02); *H10K 2102/311* (2023.02); *H10K 2102/351* (2023.02)

(58) Field of Classification Search
CPC .. H10K 59/871; H10K 59/873; H10K 77/111; H10K 2102/311; H10K 2102/351; G09F 9/30; G09F 9/33
See application file for complete search history.

(56) References Cited

U.S. PATENT DOCUMENTS 11,594,702 B2 * 2/2023 Kim ..................... H10K 77/111
2019/0025886 A1 * 1/2019 Ryu ..................... G06F 1/1641
(Continued)

FOREIGN PATENT DOCUMENTS

CN 110047393 A 7/2019
CN 110767842 A 2/2020
(Continued)

OTHER PUBLICATIONS

Office Action dated Dec. 23, 2025 for CN 202280001315.0 and English Translation.

*Primary Examiner* — J.E. Schoenholtz
(74) *Attorney, Agent, or Firm* — Ling Wu; Stephen Yang; Ling and Yang Intellectual Property

(57) ABSTRACT

The present disclosure provides a display panel and a display apparatus, wherein the display panel includes a folding area and a non-folding area located at least one side of the folding area, on a plane perpendicular to the display panel, the display panel at least includes a display substrate, an adhesive layer disposed on the display substrate, and a cover plate layer disposed at a side of the adhesive layer away from the display substrate, the cover plate layer at least includes a glass layer, the glass layer is provided with at least one structural hole at a position corresponding to the folding area, and the thickness of the glass layer is 50 μm to 500.

17 Claims, 14 Drawing Sheets

(56)     References Cited

U.S. PATENT DOCUMENTS

| | | | |
|---|---|---|---|
| 2021/0208310 A1 | 7/2021 | Kim | |
| 2022/0006038 A1* | 1/2022 | Park et al. | |
| 2022/0091637 A1* | 3/2022 | Kuon | G06F 1/1656 |
| 2022/0158124 A1* | 5/2022 | Koo | H04M 1/0268 |
| 2022/0399511 A1* | 12/2022 | Bok | B32B 27/06 |
| 2023/0038532 A1* | 2/2023 | Lee | G06F 1/1641 |
| 2024/0016035 A1* | 1/2024 | Wu | H10K 59/871 |
| 2024/0163356 A1* | 5/2024 | Bae | G06F 1/1681 |
| 2024/0251518 A1* | 7/2024 | Jo | G06F 1/1652 |

FOREIGN PATENT DOCUMENTS

| | | | |
|---|---|---|---|
| CN | 113554949 A | 10/2021 |
| CN | 214541377 U | 10/2021 |
| CN | 113889512 A | 1/2022 |
| CN | 114078395 A | 2/2022 |
| CN | 114094027 A | 2/2022 |

* cited by examiner

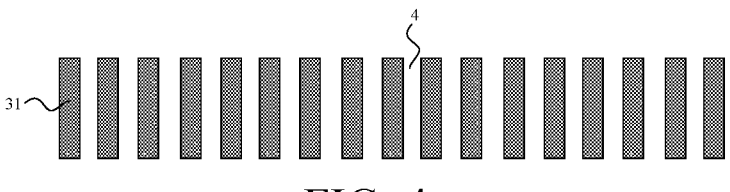
FIG. 4
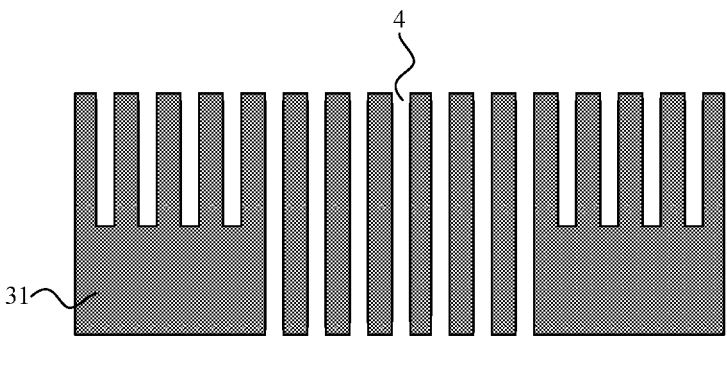
FIG. 5
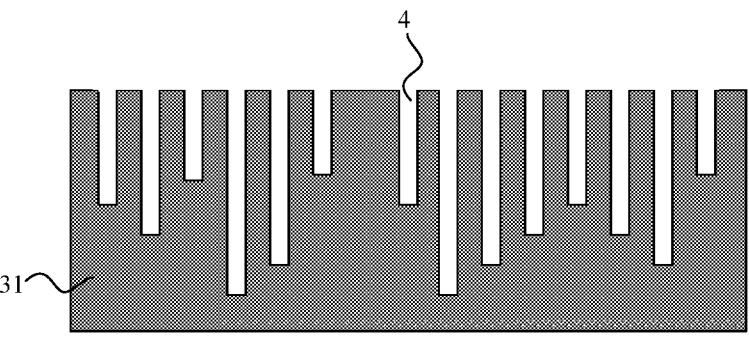
FIG. 6
FIG. 7

1

DISPLAY PANEL AND DISPLAY APPARATUS

CROSS-REFERENCE TO RELATED APPLICATION

This application is a national stage application of PCT Application No. PCT/CN2022/094240, which is filed on May 20, 2022 and entitled "Display Panel and Display Apparatus", the content of which should be regarded as being incorporated herein by reference.

TECHNICAL FIELD

Embodiments of the present disclosure relate to, but are not limited to, the field of display technologies, and more particularly, to a display panel and a display apparatus.

BACKGROUND

An Organic Light Emitting Diode (OLED for short) and a Quantum-dot Light Emitting Diode (QLED for short) are active light emitting display devices and have advantages such as self-luminescence, wide viewing angle, high contrast ratio, low power consumption, very high response speed, lightness and thinness, flexibility, and low costs. With continuous development of display technologies, a display apparatus using the OLED or the QLED as a light emitting device and using a Thin Film Transistor (TFT) for signal control has become a mainstream product in the field of display at present.

SUMMARY

The following is a summary of subject matters described herein in detail. The summary is not intended to limit the protection scope of claims.

In one aspect, the present disclosure provides a display panel, which includes a folding area and a non-folding area located at least one side of the folding area. On a plane perpendicular to the display panel, the display panel at least includes a display substrate, an adhesive layer disposed on the display substrate and a cover plate layer disposed at a side of the adhesive layer away from the display substrate, wherein the cover plate layer at least includes a glass layer, the glass layer is provided with at least one structural hole at a position corresponding to the folding area, and the glass layer has a thickness of 50 μm to 500 μm.

In an exemplary embodiment, the structural hole includes a first structural hole disposed at a side of the glass layer away from the display substrate, a depth of the first structural hole is the same as the thickness of the glass layer.

In an exemplary embodiment, the cover plate layer further includes a first filler layer that fills the first structural hole.

In an exemplary embodiment, the cover plate layer further includes at least one of a first reinforcement layer disposed at a side of the glass layer away from the display substrate and a second reinforcement layer disposed at a side of the glass layer close to the display substrate.

In an exemplary embodiment, the materials of the first filler layer, the first reinforcement layer, and the second reinforcement layer include an inorganic transparent material or an organic polymer material.

In an exemplary embodiment, a thickness of the first reinforcement layer is 20% to 50% of the thickness of the glass layer, and a thickness of the second reinforcement layer is 20% to 50% of the thickness of the glass layer.

In an exemplary embodiment, the structural hole includes a first structural hole disposed at a side of the glass layer away from the display substrate, and a depth of the first structural hole is less than the thickness of the glass layer.

In an exemplary embodiment, the cover plate layer further includes a first filler layer that fills the first structural hole and a first reinforcement layer that is disposed at a side of the glass layer away from the display substrate.

In an exemplary embodiment, the structural hole includes a first structural hole disposed at a side of the glass layer close to the display substrate, the depth of the first structural hole is less than the thickness of the glass layer.

In an exemplary embodiment, the cover plate layer further includes a first filler layer that fills the first structural hole and a second reinforcement layer that is disposed at a side of the glass layer close to the display substrate.

In an exemplary embodiment, a ratio of the depth of the first structural hole and the thickness of the glass layer is greater than or equal to ½.

In an exemplary embodiment, the structural hole includes a second structural hole disposed at a side of the glass layer close to the display substrate, the depth of the second structural hole is less than the thickness of the glass layer.

In an exemplary embodiment, the cross section of the second structural hole is in a trapezoidal or inverted trapezoidal shape.

In an exemplary embodiment, the structural hole includes a first structural hole and a second structural hole, the first structural hole is disposed at a side of the glass layer away from the display substrate, and the second structural hole is disposed at a side of the glass layer close to the display substrate, and a sum of the depths of the first structural hole and the second structural hole is less than or equal to the thickness of the glass layer.

In an exemplary embodiment, an orthographic projection of the first structural hole on the display substrate is at least partially overlapped with an orthographic projection of the second structural hole on the display substrate.

In an exemplary embodiment, the cover plate layer further includes a first filler layer that fills the first structural hole and a second filler layer that fills the second structural hole.

In an exemplary embodiment, the cover plate layer further includes at least one of a first reinforcement layer disposed at a side of the glass layer away from the display substrate and a second reinforcement layer disposed at a side of the glass layer close to the display substrate.

In an exemplary embodiment, the first filler layer, the first reinforcement layer, the second reinforcement layer, and the second filler layer adopts the same or different materials; optionally, the materials of the first filler layer, the first reinforcement layer, the second reinforcement layer, and the second filler layer include an inorganic transparent material or an organic polymer material.

In an exemplary embodiment, in a plane parallel to the display panel, the shape of the first structural hole includes any one or more of the following: triangle, square, rectangle, pentagon, hexagon, polygon, circle and ellipse.

In an exemplary embodiment, the shape of the first structural hole is a strip shape extending along a first direction, a cross-sectional width of the first structural hole is the same or different, the cross-sectional width is a dimension in a second direction, the first direction intersects with the second direction.

In an exemplary embodiment, a cross-sectional width of a middle area of the first structural hole is less than a cross-sectional width of two end areas of the first structural hole along the first direction.

In another aspect, a display apparatus is provided, including the aforementioned display panel.

Other aspects may be understood upon reading and understanding the drawings and the detailed description.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of components in the drawings do not reflect actual scales, and are only intended to schematically illustrate contents of the present disclosure.

FIG. 4 is a schematic diagram of a cross-sectional structure of a glass layer according to an exemplary embodiment of the present disclosure.

FIG. 5 is a schematic diagram of a cross-sectional structure of another glass layer according to an exemplary embodiment of the present disclosure.

FIG. 6 is a schematic diagram of a cross-sectional structure of yet another glass layer according to an exemplary embodiment of the present disclosure.

FIG. 7 is a schematic diagram of a cross-sectional structure of yet another glass layer according to an exemplary embodiment of the present disclosure.

DETAILED DESCRIPTION

Figure 1:
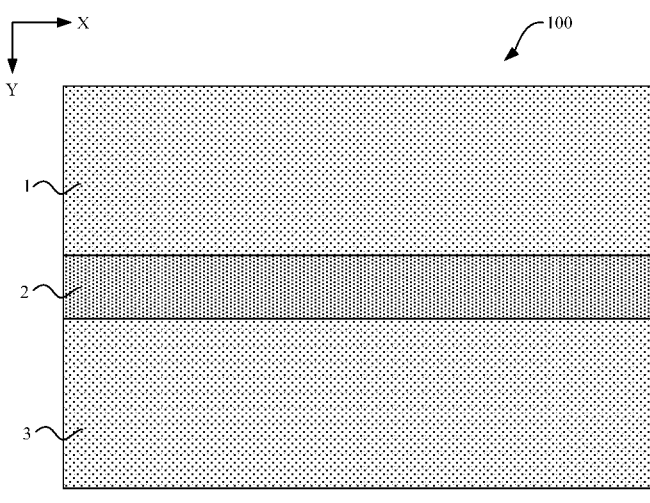
FIG. 1 is a schematic diagram of a planar structure of a display panel according to an exemplary embodiment of the present disclosure.

To make objectives, technical solutions, and advantages of the present disclosure clearer, the embodiments of the present disclosure will be described in detail with reference to the accompanying drawings. It is to be noted that implementation modes may be implemented in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

Scales of the drawings in the present disclosure may be used as a reference in the actual process, but are not limited thereto. For example, the width-length ratio of the channel, the thickness and spacing of each film layer, and the width and spacing of each signal line may be adjusted according to actual needs. The number of pixels in the display substrate and the number of sub-pixels in each pixel are not limited to the numbers shown in the drawings. The drawings described in the present disclosure are schematic structure diagrams only, and one implementation of the present disclosure is not limited to the shapes, numerical values or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the various constituent elements. Therefore, appropriate replacements may be made according to situations without being limited to the wordings described in the specification.

In the specification, unless otherwise specified and defined explicitly, terms "mount", "mutually connect", and "connect" should be understood in a broad sense. It may be a mechanical connection or an electrical connection. It may be a direct mutual connection, or an indirect connection through middleware, or internal communication between two components. Those of ordinary skill in the art may understand specific meanings of these terms in the present disclosure according to specific situations.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, square, rectangle, trapezoid, pentagon and hexagon in this specification are not strictly defined, and they may be approximate triangle, square, rectangle, trapezoid, pentagon or hexagon, etc. There may be some small deformation caused by tolerance, and there may be chamfer, arc edge and deformation, etc.

In the present disclosure, "about" refers to that a boundary is defined not so strictly and numerical values within process and measurement error ranges are allowed.

With the development of display technology, a flexible display apparatus may be wound, folded and bent to change its screen size. Therefore, a rollable display apparatus, a bendable display apparatus, a foldable display apparatus, or a slidable display apparatus is formed, which can be applied not only to mobile devices such as smart phones and flat-panel personal computers, but also to televisions, vehicle display apparatuses and wearable devices. The application fields of the flexible display apparatus are expanding. The foldable display apparatus has been gradually applied to folding mobile phones and other electronic devices because of its flexible and foldable characteristics, which can make the display apparatus thinner and more portable.

At present, in order to meet and improve the bending performance of foldable display apparatuses, the glass layer with smaller thickness is usually used. However, it is found that a relatively thin glass layer is easy to be broken and has poor impact resistance during use, and its mechanical properties, especially the performance of falling balls and falling pen, are not satisfying. In addition, a relatively thin glass layer cannot be directly used as a cover plate.

Exemplary embodiments of the present disclosure provide a display panel, which includes a folding area and a non-folding area located at least one side of the folding area. On a plane perpendicular to the display panel, the display panel at least includes a display substrate, an adhesive layer disposed on the display substrate and a cover layer disposed at a side of the adhesive layer away from the display substrate, wherein the cover plate layer at least includes a glass layer, the glass layer is provided with at least one structural hole at a position corresponding to the folding area, and the glass layer has a thickness of 50 μm to 500 μm.

In an exemplary embodiment, the structural hole includes a first structural hole disposed at a side of the glass layer away from the display substrate, a depth of the first structural hole is the same as the thickness of the glass layer.

In an exemplary embodiment, the cover plate layer further includes a first filler layer that fills the first structural hole.

In an exemplary embodiment, the cover plate layer further includes at least one of a first reinforcement layer disposed at a side of the glass layer away from the display substrate and a second reinforcement layer disposed at a side of the glass layer close to the display substrate.

In an exemplary embodiment, the structural hole includes a second structural hole disposed at a side of the glass layer close to the display substrate, the depth of the second structural hole is less than the thickness of the glass layer.

In an exemplary embodiment, the structural hole includes a first structural hole and a second structural hole, the first structural hole is disposed at a side of the glass layer away from the display substrate, and the second structural hole is disposed at a side of the glass layer close to the display substrate, and a sum of the depths of the first structural hole and the second structural hole is less than or equal to the thickness of the glass layer.

In an exemplary embodiment, the structural hole includes a first structural hole and a second structural hole, the first structural hole is disposed at a side of the glass layer close to the display substrate, and the second structural hole is disposed at a side of the glass layer away from the display substrate, and a sum of the depths of the first structural hole and the second structural hole is less than or equal to the thickness of the glass layer.

FIG. 1 is a schematic diagram of a planar structure of a display panel according to an exemplary embodiment of the present disclosure. In an exemplary embodiment, the flat or unfolded display panel 100 is disposed in a plane defined by, but not limited to, a first direction X and a second direction Y that intersect with each other, the first direction X intersects with the second direction Y. On a plane parallel to the display panel 100, the display panel 100 may at least include a first non-folding area 1, a folding area 2, and a second non-folding area 3 arranged sequentially along the second direction Y. The first non-folding area 1 may be located at a side of the folding area 2 in a direction opposite to the second direction Y, and the second non-folding area 3 may be located at a side of the folding area 2 in the second direction Y. In an exemplary embodiment, the first non-folding area 1 and the second non-folding area 3 may be rectangular, and the folding areas 2 may be strip-shaped extending along the first direction X.

In an exemplary embodiment, the display panel may include a plurality of folding areas. The number of folding areas and non-folding areas, the division mode, and the positional relationship can be determined according to actual needs, which are not limited in the present disclosure. In the following exemplary embodiments, the illustration is made by taking a display panel including three portions (a folding area, and a first non-folding area and a second non-folding area on two sides of the folding area, respectively) as an example.

Figure 2:
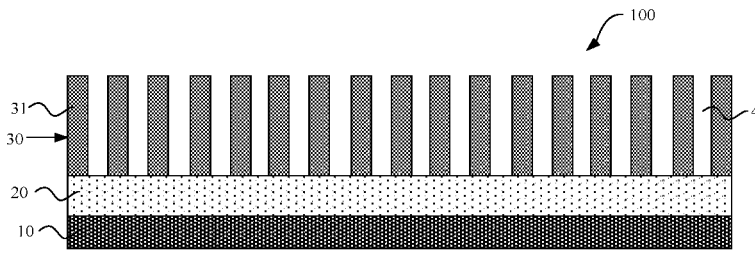
FIG. 2 is a schematic diagram of a cross-sectional structure of a folding area of a display panel according to an exemplary embodiment of the present disclosure.

FIG. 2 is a schematic diagram of a cross-sectional structure of a folding area in a display panel according to an exemplary embodiment of the present disclosure. As shown in FIG. 2, on a plane perpendicular to the display panel, the folding area 2 of the display panel 100 may at least include a display substrate 10, an adhesive layer 20 disposed on the display substrate 10, and a cover plate layer 30 disposed at a side of the adhesive layer 20 away from the display substrate 10.

In an exemplary embodiment, the first non-folding area 1 and the second non-folding area 3 of the display panel also correspondingly have a display substrate 10, an adhesive layer 20 and a cover plate layer 30.

In an exemplary embodiment, the display substrate 10 may be an OLED display panel. The OLED display substrate may at least include a driving circuit layer disposed on a base substrate, a light emitting structure layer disposed on the driving circuit layer, wherein the light emitting structure layer may include an anode, a cathode, and an organic light emitting layer disposed between the anode and the cathode. The organic light emitting layer may include a hole injection layer, a hole transport layer, an electron blocking layer, a light emitting layer, a hole blocking layer, an electron transport layer, an electron injection layer, and the like that are stacked.

In an exemplary embodiment, the adhesive layer 20 may be made of an optically transparent adhesive (OCA) or an optically transparent resin which may be a thermosetting type optically transparent resin or an ultraviolet curing type optically transparent resin.

In an exemplary embodiment, the cover plate layer 30 may be referred to as Ultra-thin Glass (UTG). The cover plate layer 30 may at least include a glass layer 31, the glass layer 31 may be provided with at least one first structural hole 4 as a structural hole at a position corresponding to the folding area 2, and the at least one first structural hole 4 may be configured to improve the folding performance of the folding area.

In an exemplary embodiment, the thickness of the glass layer may be about 50 μm to 500 μm. Preferably, the glass layer may take a relatively large thickness greater than 100 μm, for example, a thickness of the glass layer in the range of about 100 μm to 500 μm, such as 150 μm, 200 μm, 300 μm, 400 μm.

In an exemplary embodiment, on a plane parallel to the display panel, the shape of the first structural hole includes any one or more of the following: triangle, square, rectangle, pentagon, hexagon, circle and ellipse.

In an exemplary embodiment, on a plane parallel to the display panel, at least one first structural hole has a first dimension that is a dimension in the first direction X and a second dimension that is a dimension in the second direction Y. In an exemplary embodiment, on a plane parallel to the display panel, the first structural hole may be in the shape of a circle, a square, an equilateral triangle, or the like when the first dimension and the second dimension of the first structural hole are the same. In an exemplary embodiment, on a plane parallel to the display panel, when the first dimension of the first structural hole is larger than the second dimension or the second dimension is larger than the first dimension, the first structural hole may be elliptical, strip-shaped rectangular, diamond-shaped, polygonal, or the like.

Figure 3:
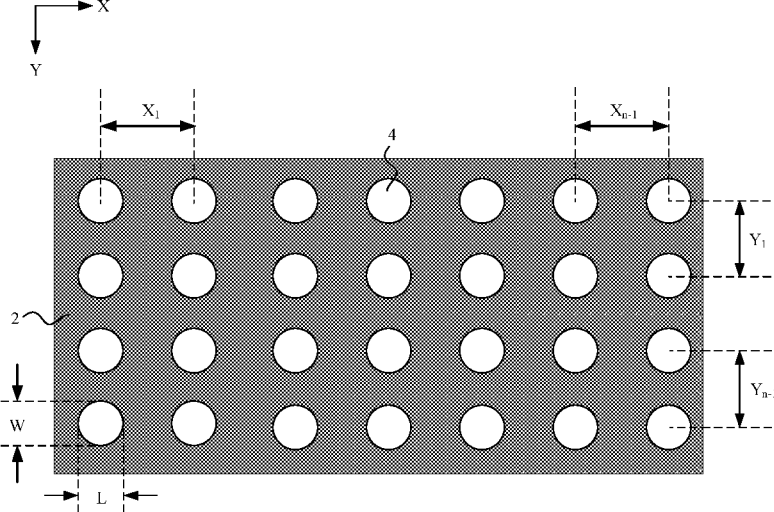
FIG. 3 is a schematic diagram of a planar structure of a glass layer according to an exemplary embodiment of the present disclosure.

FIG. 3 is a schematic diagram of a planar structure of a glass layer according to an exemplary embodiment of the present disclosure, showing the arrangement of circular first structural holes in the glass layer in the folding area 2. As shown in FIG. 3, in an exemplary embodiment, a plurality of first structural holes 4 may be arranged in an array form including a plurality of hole rows and a plurality of hole columns. The hole rows may include a plurality of first structural holes arranged sequentially along the first direction X, the plurality of hole rows arranged sequentially along the second direction Y in an aligned manner, and may be referred to as a first hole row, a second hole row . . . an n-th hole row from top to bottom. The hole columns may include a plurality of first structural holes arranged sequentially along the second direction Y, the plurality of holes arranged sequentially along the first direction X in an aligned manner, and may be referred to as a first hole column, a second hole column . . . an n-th hole column from left to right. n is a positive integer greater than or equal to 2;

In an exemplary embodiment, in the folding area 2, at least one circular first structural hole 4 has a diameter D. In the first direction X, a center distance between the first hole row and the second hole row is T1, a center distance between the second hole row and the third hole row is T2 . . . a center distance between the (n−1)th hole row and the n-th hole row is Tn−1. In the second direction Y, a center distance between the first hole column and the second hole column is S1, a center distance between the second hole column and the third hole column is S2 . . . a center distance between the (n−1)th hole column and the n-th hole column is Sn−1. In an exemplary embodiment, the center distance refers to a distance between the geometric centers of two circles.

In exemplary embodiments, D may be in the range of 0.5 μm to 500 μm, S may be in the range of 1 μm to 5000 μm, and T may be in the range of 1 μm to 10000 μm.

In an exemplary embodiment, in the first direction X, a distance between the first hole column and an edge at a side of the folding area 2 in a direction opposite to the first direction X (hereinafter referred to as a left edge of the folding area) may be less than S1; a distance between the n-th hole column and an edge at a side of the folding area 2 in the same direction as the first direction X (hereinafter referred to as a right edge of the folding area) may be less than Sn−1. In the second direction Y, a distance between the first hole row and an edge at a side of the folding area 2 in a direction opposite to the second direction Y (hereinafter referred to as an upper edge of the folding area) may be less than T1; a distance between n-th hole row and an edge at a side of the folding area 2 in the same direction as the second direction Y (hereinafter referred to as a lower edge of the folding area) may be less than Tn−1.

In an exemplary embodiment, the diameters D of the plurality of first structural holes 4 may be the same, and along the first direction X, the center distance T1 between the first hole row and the second hole row, the center distance T2 between the second hole row and the third hole row, and the center distance Tn−1 between the (n−1)th hole row and the n-th hole row may be the same. In the second direction Y, the center distance between the first hole column and the second hole column is S1, the center distance between the second hole column and the third hole column is S2 . . . the center distance between the (n−1)th hole column and the n-th hole column is Sn−1, and the center distances S in the first direction X and the center distances T in the second direction Y are also the same. The distance between the first hole column and the left edge of the folding area, the distance between the n-th hole column and the right edge of the folding area, the distance between the first hole row and the upper edge of the folding area, and the distance between the n-th hole row and the lower edge of the folding area may also be the same. Such uniformly arranged circular hole structure enables the display panel to be subjected uniform force upon being folded.

In an exemplary embodiment, the diameter of the circular first structural hole may be adjusted according to a desired folding performance such as a folding radius, a folding life, and the numerical range of the center distance S between adjacent holes in the first direction X and the center distance T between adjacent holes in the second direction Y may also be adjusted. For example, S1, S2 . . . . Sn−1 in the first direction X are all the same and T1, T2 . . . . Tn−1 in the second direction Y are all equal, but the center distance S in the first direction X is different from the center distance T in the second direction Y. The center distance S in the first direction X may be greater than the center distance T in the second direction Y; alternatively, the center distance S in the first direction X may be less than the center distance T in the second direction Y.

In an exemplary embodiment, the values of S1, S2 . . . . Sn−1 in the first direction X may be monotonically increased or monotonically decreased. Alternatively, the values of T1, T2 . . . . Tn−1 in the second direction Y may be monotonically increased or monotonically decreased. Alternatively, the values of S1, S2 . . . . Sn−1 in the first direction X and T1, T2 . . . . Tn−1 in the second direction Y may be set according to other sequence laws.

In an exemplary embodiment, the plurality of first structural holes may also be arranged in other regular ways. For example, the first hole row, the second hole row . . . and the n-th hole row are all arranged obliquely at a certain angle α to the first direction X; at the center of the folding area, the density of the first structural holes is the highest, and the density of the first structural hole gradually decreases when extending to the left edge and the right edge along the first direction X; the density of the first structural holes also gradually decreases when extending along the second direction Y to the upper side edge and the lower side edge.

FIG. 4 is a schematic diagram of a cross-sectional structure of a glass layer according to an exemplary embodiment of the present disclosure. As shown in FIG. 4, a plurality of first structural holes 4 may be provided on the glass layer. The first structural hole 4 may be in the form of a through hole structure, i.e. the first structural hole 4 penetrates through the glass layer 31, and a depth of the first structural hole 4 is the same as the thickness of the glass layer 31.

FIG. 5 is a schematic diagram of a cross-sectional structure of another glass layer according to an exemplary embodiment of the present disclosure. As shown in FIG. 5, a plurality of first structural holes 4 may be disposed at a side of the glass layer 31 away from the display substrate. The first structural hole 4 may be in the form of a blind hole structure, i.e. the first structural hole 4 does not penetrate through the glass layer 31, and the depth of the first structural hole 4 is less than the thickness of the glass layer 31.

FIG. 6 is a schematic diagram of a cross-sectional structure of yet another glass layer according to an exemplary embodiment of the present disclosure. As shown in FIG. 6, the glass layer 31 may be provided with a plurality of first structural holes 4 including first structural holes in the form of a blind hole and first structural holes in the form of a through hole.

In an exemplary embodiment, a plurality of first structural holes in the form of through holes may be disposed in a middle area of the folding area to form a through hole area; a plurality of first structural holes in the form of blind holes may be disposed at a periphery of the through hole area to form a blind hole area.

In an exemplary embodiment, the depth of the first structural holes 4 in the form of blind holes may be the same or may be different.

FIG. 7 is a schematic diagram of a cross-sectional structure of yet another glass layer according to an exemplary embodiment of the present disclosure. As shown in FIG. 7, a plurality of first structural holes 4 may be disposed at a side of the glass layer 31 away from the display substrate. The first structural hole 4 may be in the form of a blind hole structure.

In an exemplary embodiment, some of the first structural holes 4 may have a first depth, while some other first structural holes 4 may have a second depth different from the first depth, and still some other first structural holes 4 may have a third depth different from the first depth and the second depth.

Figure 8:
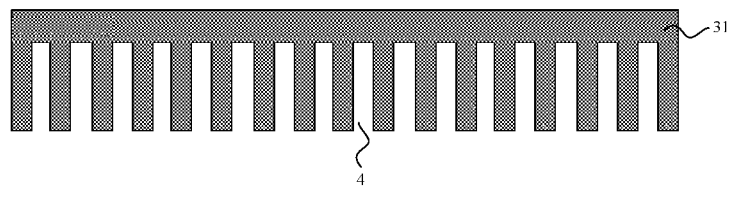
FIG. 8 is a schematic diagram of a cross-sectional structure of yet another glass layer according to an exemplary embodiment of the present disclosure.

FIG. 8 is a schematic diagram of a cross-sectional structure of yet another glass layer according to an exemplary embodiment of the present disclosure. As shown in FIG. 8, a plurality of first structural holes 4 may be disposed at a side of the glass layer 31 close to the display substrate. The first structural hole 4 may be in the form of a blind hole structure, i.e. the first structural hole 4 does not penetrate through the glass layer, and the depth of the first structural hole 4 is less than the thickness of the glass layer 31.

In exemplary embodiments, the ratio of the depth of the first structural hole to the thickness of the glass layer may be greater than or equal to ½. For example, when the thickness of the glass layer is 100 µm, the depth of the first structural hole may be 50 µm, 60 µm, 70 µm, 80 µm, 90 µm, 100 µm, etc.

Figure 9:
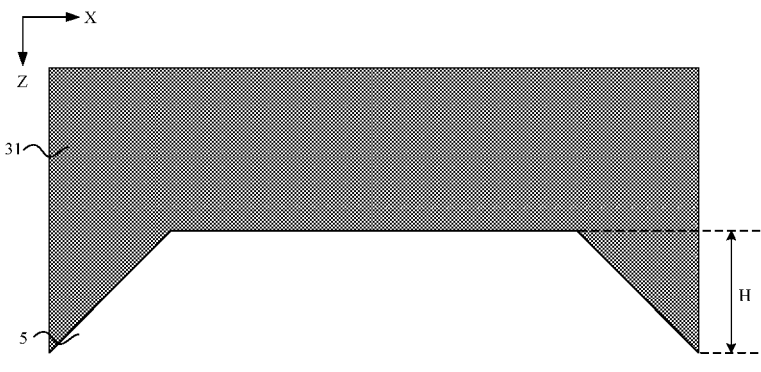
FIG. 9 is a schematic diagram of a cross-sectional structure of yet another glass layer according to an exemplary embodiment of the present disclosure.

FIG. 9 is a schematic diagram of a cross-sectional structure of yet another glass layer according to an exemplary embodiment of the present disclosure. As shown in FIG. 9, in the folding area, the glass layer 31 may include at least one second structural hole 5 as a structural hole. At least one second structural hole 5 may be disposed at a side of the glass layer 31 close to the display substrate. The cross section of the second structural hole 5 has a trapezoidal shape. The second structural hole 5 has a first length, a second length and a depth H. The first length is a dimension along the first direction X, i.e. the first length is a length of a short edge at a side of the second structural hole 5 having a trapezoidal cross-section away from the display substrate; the second length is a dimension along the first direction X, i.e. the second length is a length of a long edge at a side of the second structural hole 5 having a trapezoidal shape close to the display substrate; and the depth is a dimension along the third direction Z (i.e., the thickness direction of the glass layer). The first length may be less than the second length. The depth H may be less than the thickness of the glass layer 31.

In some possible exemplary embodiments, at least one second structural hole 5 may be disposed at a side of the glass layer 31 away from the display substrate, the cross section of the at least one second structural hole 5 has an inverted trapezoidal shape.

Figure 10:
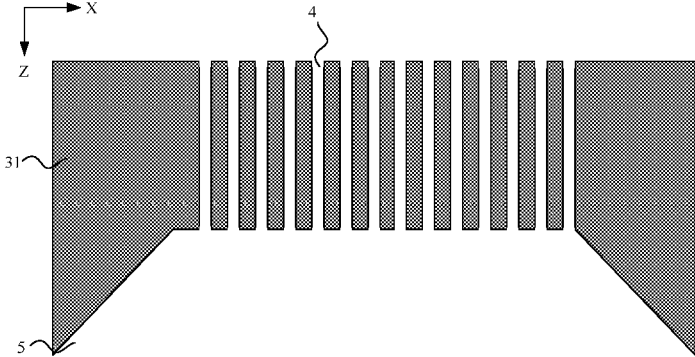
FIG. 10 is a schematic diagram of a cross-sectional structure of yet another glass layer according to an exemplary embodiment of the present disclosure.

FIG. 10 is a schematic diagram of a cross-sectional structure of yet another glass layer according to an exemplary embodiment of the present disclosure. As shown in FIG. 10, the glass layer 31 may be provided with at least one first structural hole 4 as a structural hole and at least one second structural hole 5 as a structural hole. The second structural hole 5 is disposed at a side of the glass layer 31 close to the display substrate and has a trapezoidal cross section. In the third direction Z, in an area corresponding to a first length of the second structural hole 5, the first structural hole 4 is disposed at a side of the glass layer 31 away from the display substrate and communicated with the second structural hole 5. The sum of the depth of the first structural hole 4 and the depth of the second structural hole 5 may be equal to the thickness of the glass layer 31. An orthographic projection of the first structural hole on the display substrate is within a range of an orthographic projection of the second structural hole on the display substrate.

In some possible exemplary embodiments, the orthographic projection of the first structural hole on the display substrate is at least partially overlapped with the orthographic projection of the second structural hole on the display substrate.

Figure 11:
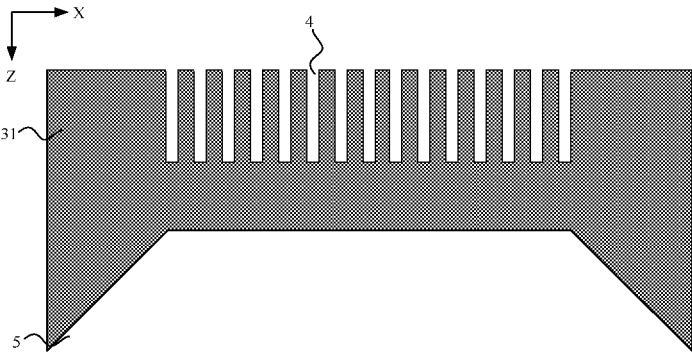
FIG. 11 is a schematic diagram of a cross-sectional structure of yet another glass layer according to an exemplary embodiment of the present disclosure.

FIG. 11 is a schematic diagram of a cross-sectional structure of yet another glass layer according to an exemplary embodiment of the present disclosure. As shown in FIG. 11, the glass layer 31 may be provided with at least one first structural hole 4 as a structural hole and at least one second structural hole 5 as a structural hole. The second structural hole 5 is disposed at a side of the glass layer 31 close to the display substrate and has a trapezoidal cross section. In the third direction Z, in an area corresponding to a first length of the second structural hole 5, the first structural hole 4 is disposed at a side of the glass layer 31 away from the display substrate and not communicated with the second structural hole. The sum of the depth of the first structural hole 4 and the depth of the second structural hole 5 may be less than the thickness of the glass layer 31.

Figures 12, 13, 14, 15:
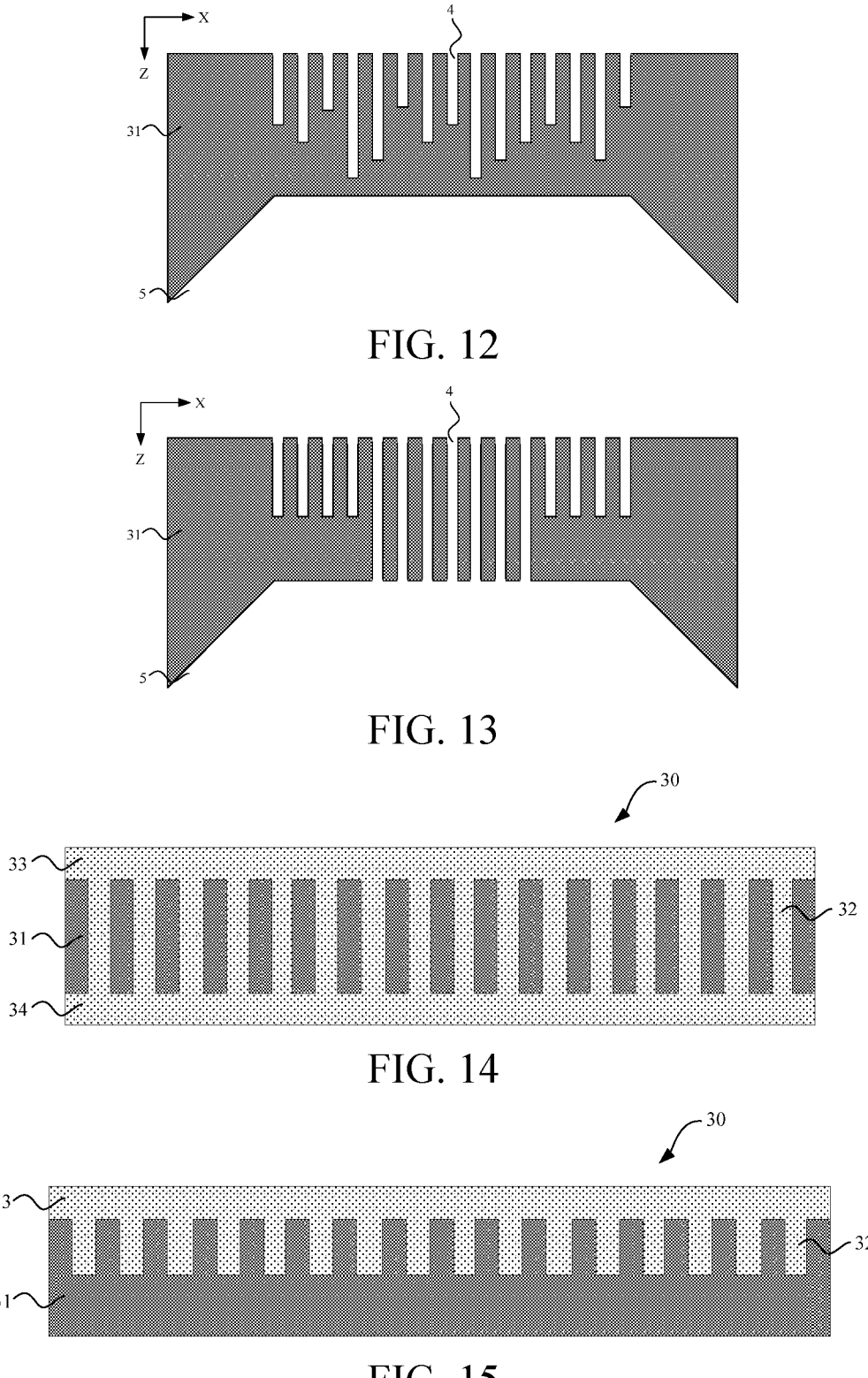
FIG. 12 is a schematic diagram of a cross-sectional structure of yet another glass layer according to an exemplary embodiment of the present disclosure.
FIG. 13 is a schematic diagram of a cross-sectional structure of yet another glass layer according to an exemplary embodiment of the present disclosure.
FIG. 14 is a schematic diagram of a cross-sectional structure of a cover plate layer according to an exemplary embodiment of the present disclosure.
FIG. 15 is a schematic diagram of a cross-sectional structure of another cover plate layer according to an exemplary embodiment of the present disclosure.

FIG. 12 is a schematic diagram of a sectional structure of yet another glass layer according to an exemplary embodiment of the present disclosure. As shown in FIG. 12, the glass layer 31 may be provided with at least one first structural hole 4 as a structural hole and at least one second structural hole 5 as a structural hole. The second structural hole 5 may be disposed at a side of the glass layer 31 close to the display substrate may and has a trapezoidal cross section. In the third direction Z, in an area corresponding to a first length of the second structural hole 5, a plurality of first structural holes 4 may be disposed at a side of the glass layer 31 away from the display substrate may and not communicated with the second structural hole. The sum of the depth of the first structural hole 4 and the depth of the second structural hole 5 may be less than the thickness of the glass layer 31. The first structural holes 4 may have different depths.

FIG. 13 is a schematic diagram of a cross-sectional structure of yet another glass layer according to an exemplary embodiment of the present disclosure. As shown in FIG. 13, the glass layer 31 may be provided with at least one first structural hole 4 as a structural hole and at least one second structural hole 5 as a structural hole. The second structural hole 5 may be disposed at a side of the glass layer 31 close to the display substrate may and has a trapezoidal cross section. In the third direction Z, in an area corresponding to the first length of the second structural hole 5, a plurality of first structural holes 4 may be disposed at a side of the glass layer 31 away from the display substrate. In the middle area of the folding area, the first structural hole 4 is communicated with the second structural hole 5, i.e. the sum of the depth of the first structural hole 4 and the depth of the second structural hole 5 is equal to the thickness of the glass layer 31. At two sides of the folding area, the first structural hole 4 and the second structural hole 5 are communicated, i.e. the sum of the depth of the first structural hole 4 and the depth of the second structural hole 5 is less than the thickness of the glass layer 31. The depths of the first structural holes 4 which are not communicated with the second structural hole 5 may be different.

In an exemplary embodiment, in the third direction Z, in the area corresponding to the first length of the second structural hole 5, various forms of first structural holes may be provided, including the forms of various first structural holes as shown in FIGS. 4 to 8.

In some possible exemplary embodiments, various forms of first structural holes may be provided along the third direction Z in the area corresponding to the second length of the second structural hole.

In some possible exemplary embodiments, the structural hole includes a first structural hole and a second structural hole, the first structural hole is disposed at a side of the glass layer close to the display substrate, and the second structural hole is disposed at a side of the glass layer away from the display substrate, and a sum of the depths of the first structural hole and the second structural hole may be less than or equal to a thickness of the glass layer.

FIG. 14 is a schematic diagram of a cross-sectional structure of a cover plate layer according to an exemplary embodiment of the present disclosure. As shown in FIG. 14, the cover plate layer 30 may include a glass layer 31, a first filler layer 32, a first reinforcement layer 33 and a second reinforcement layer 34. The glass layer 31 is provided with a plurality of first structural holes, the first structural holes may be in the form of a through-hole structure, and the depth of the first structural holes is the same as the thickness of the glass layer 31. The first filler layer 32 fills a plurality of first structural holes. The first reinforcement layer 33 is disposed on a side of the glass layer 31 away from the display substrate and the second reinforcement layer 34 is disposed at a side of the glass layer 31 close to the display substrate.

In one possible exemplary embodiment the cover plate layer 30 may further include at least one of the first reinforcement layer 33 and the second reinforcement layer 34;

alternatively the cover plate layer 30 may not include the first reinforcement layer 33 and the second reinforcement layer 34.

In an exemplary embodiment, the materials of the first filler layer, the first reinforcement layer and the second reinforcement layer may include an inorganic transparent material and an organic polymer material to enhance the mechanical properties of the cover plate layer.

In exemplary embodiments, a thickness of the first reinforcement layer may be about 20% to about 50% of the thickness of the glass layer, and a thickness of the second reinforcement layer may be about 20% to about 50% of the thickness of the glass layer.

FIG. 15 is a schematic diagram of a cross-sectional structure of another cover plate layer according to an exemplary embodiment of the present disclosure. As shown in FIG. 15, the cover plate layer may include a glass layer 31, a first filler layer 32 and a first reinforcement layer 33. A plurality of first structural holes are disposed at a side of the glass layer 31 away from the display substrate, the first structural holes may be in the form of a blind hole structure, and the depth of the first structural holes is less than the thickness of the glass layer 31. The first filler layer 32 fills the first structural holes. The first reinforcement layer 33 is disposed at a side of the glass layer 31 away from the display substrate.

Figure 16:
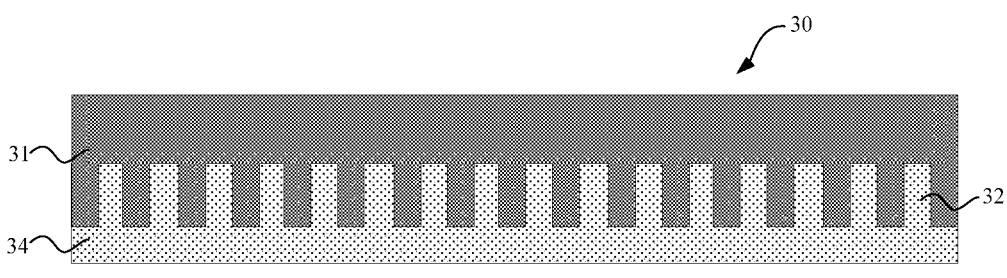
FIG. 16 is a schematic diagram of a cross-sectional structure of yet another cover plate layer according to an exemplary embodiment of the present disclosure.

FIG. 16 is a schematic diagram of a cross-sectional structure of yet another cover plate layer according to an exemplary embodiment of the present disclosure. As shown in FIG. 16, the cover plate layer may include a glass layer, 31 a first filler layer 32 and a second reinforcement layer 34. A plurality of first structural holes are disposed at a side of the glass layer 31 close to the display substrate. The first structural holes may be in the form of a blind hole structure and the depth of the first structural holes is less than the thickness of the glass layer 31. The first filler layer 32 fills the first structural holes. The second reinforcement layer 34 is disposed at a side of the glass layer 31 close to the display substrate.

Figure 17:
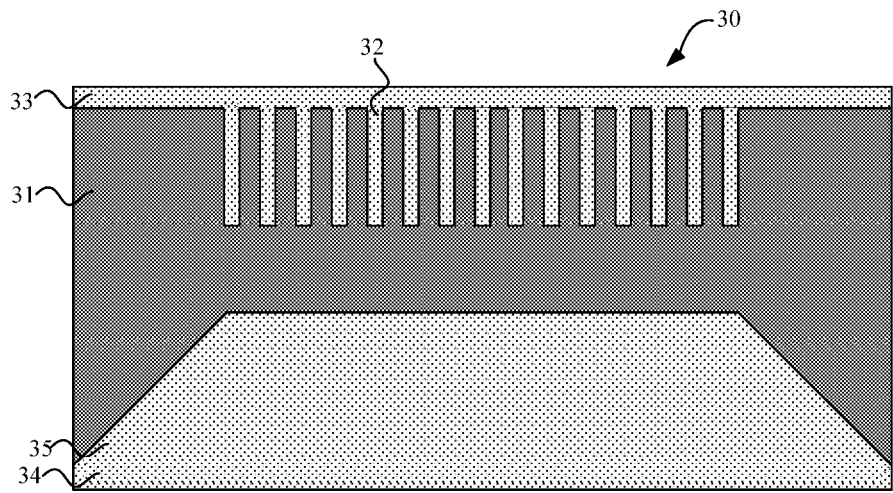
FIG. 17 is a schematic diagram of a cross-sectional structure of yet another cover plate layer according to an exemplary embodiment of the present disclosure.

FIG. 17 is a schematic diagram of a cross-sectional structure of yet another cover plate layer according to an exemplary embodiment of the present disclosure. As shown in FIG. 17, the cover plate layer may include a glass layer 31, a first filler layer 32, a first reinforcement layer 33, a second reinforcement layer 34 and a second filler layer 35. The glass layer 31 is provided with a plurality of first structural holes as structural holes and at least one second structural hole as structural hole. The second structural hole is disposed at a side of the glass layer 31 close to the display substrate. In an area corresponding to the first length of the second structural hole, a plurality of first structural holes are disposed at a side of the glass layer 31 away from the display substrate. The first structural hole is not communicated with the second structural hole. The sum of the depth of the first structural hole and the depth of the second structural hole may be less than the thickness of the glass layer 31. The first filler layer 32 fills a plurality of first structural holes. The first reinforcement layer 33 is disposed at a side of the glass layer 31 away from the display substrate and the second reinforcement layer 34 is disposed at a side of the glass layer 31 close to the display substrate. The second filler layer 35 fills the at least one second structural hole.

In exemplary embodiments, the materials of the first filler layer, the first reinforcement layer, the second reinforcement layer, and the second filler layer may be the same or different materials. In exemplary embodiments, the materials of the first filler layer, the first reinforcement layer, the second reinforcement layer, and the second filler layer may include an inorganic transparent material and an organic polymer material.

Figure 18:
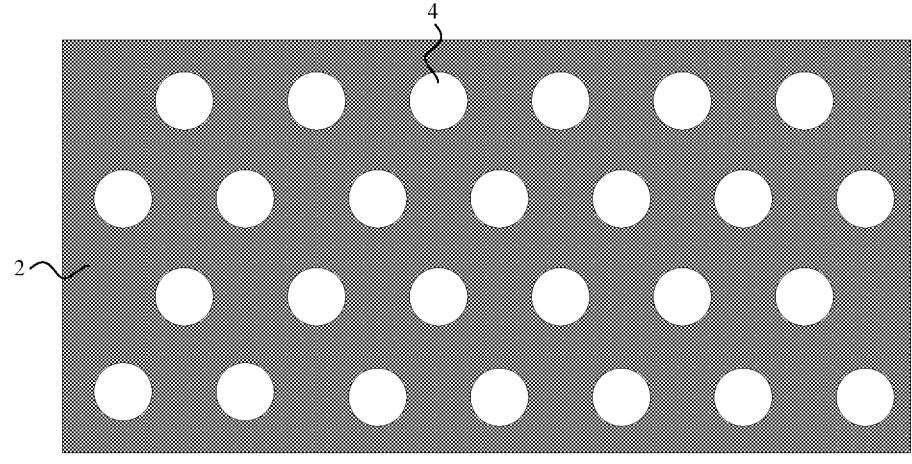
FIG. 18 is a schematic diagram of a planar structure of another glass layer according to an exemplary embodiment of the present disclosure.

FIG. 18 is a schematic diagram of a planar structure of another glass layer according to an exemplary embodiment of the present disclosure, showing the arrangement of circular first structural holes in the glass layer in the folding area 2. As shown in FIG. 18, a plurality of first structural holes may be arranged in an array form including a plurality of hole rows and a plurality of hole columns. The second hole row is displaced relative to the first hole row in the first direction X, so that the second hole row and the first hole row are alternately arranged. The third hole row is arranged in the same manner as the first hole row, and the fourth hole row is arranged in the same manner as the second hole row, so that the holes of two adjacent rows are alternately arranged, and the holes of two adjacent columns are alternately arranged.

Figure 19:
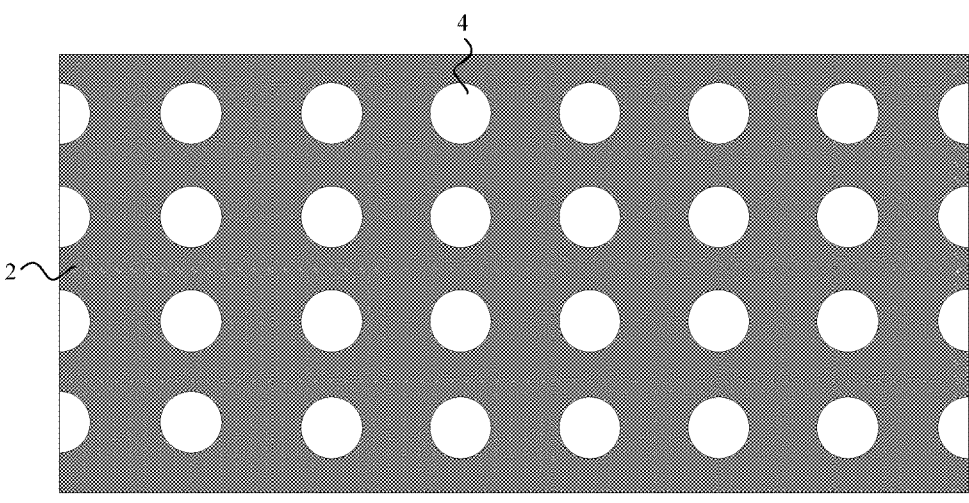
FIG. 19 is a schematic diagram of a planar structure of yet another glass layer according to an exemplary embodiment of the present disclosure.

FIG. 19 is a schematic diagram of a planar structure of yet another glass layer according to an exemplary embodiment of the present disclosure, showing the arrangement of circular first structural holes in the glass layer in the folding area 2. As shown in FIG. 19, the dimension of the first structural holes and the center distance between adjacent first structural holes are substantially similar to the arrangement shown in FIG. 3, but the first hole column is disposed on the left edge of the folding area 2 and the n-th hole column is disposed on the right edge of the folding area 2.

In an exemplary embodiment, only the first hole column may be disposed on the left edge of the folding area; alternatively, only the n-th hole column may be disposed on the right edge of the folding area.

Figure 20:
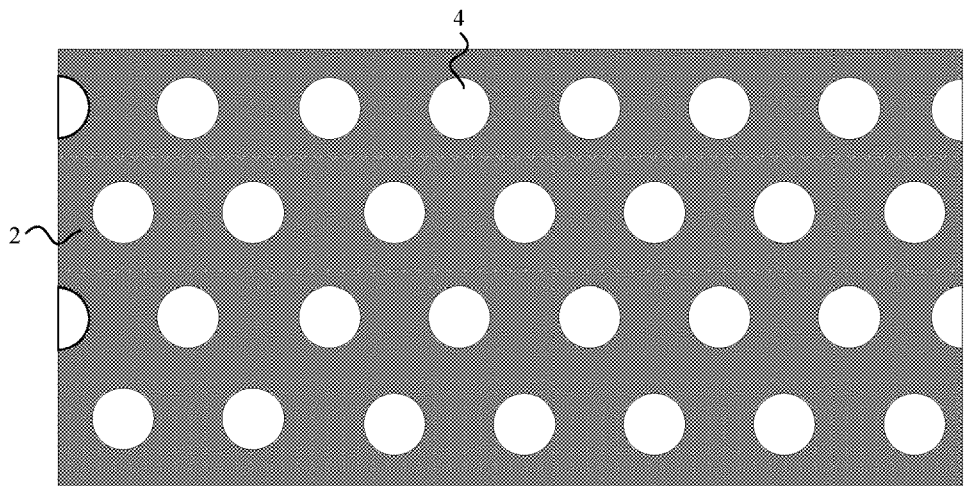
FIG. 20 is a schematic diagram of a planar structure of yet another glass layer according to an exemplary embodiment of the present disclosure.

FIG. 20 is a schematic diagram of a planar structure of yet another glass layer according to an exemplary embodiment of the present disclosure, showing the arrangement of circular first structural holes in the glass layer in the folding area 2. As shown in FIG. 20, the dimension of the first structural holes and the center distance between adjacent first structural holes are substantially similar to the arrangement shown in FIG. 18. However, the first hole column is disposed on the left edge of the folding area 2 and the n-th hole column is disposed on the right edge of the folding area 2.

In an exemplary embodiment, only the first hole column may be disposed on the left edge of the folding area; alternatively, only the n-th hole column may be disposed on the right edge of the folding area.

Figure 21:
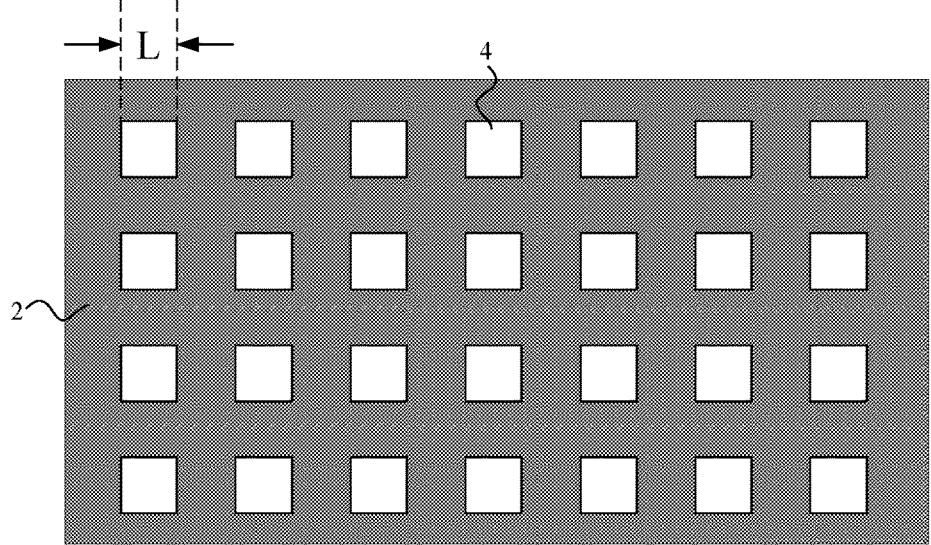
FIG. 21 is a schematic diagram of a planar structure of yet another glass layer according to an exemplary embodiment of the present disclosure.

FIG. 21 is a schematic diagram of a planar structure of yet another glass layer according to an exemplary embodiment of the present disclosure, showing the arrangement of square first structural holes in the glass layer in the folding area 2. As shown in FIG. 21, a plurality of first structural holes 4 may be arranged in an array form including a plurality of hole rows and a plurality of hole columns. The hole rows may include a plurality of first structural holes sequentially arranged along the first direction X in an aligned manner, and the hole columns may include a plurality of first structural holes sequentially arranged along the second direction Y in an aligned manner. The side lengths L of the first structural holes 4 are the same.

Figure 22:
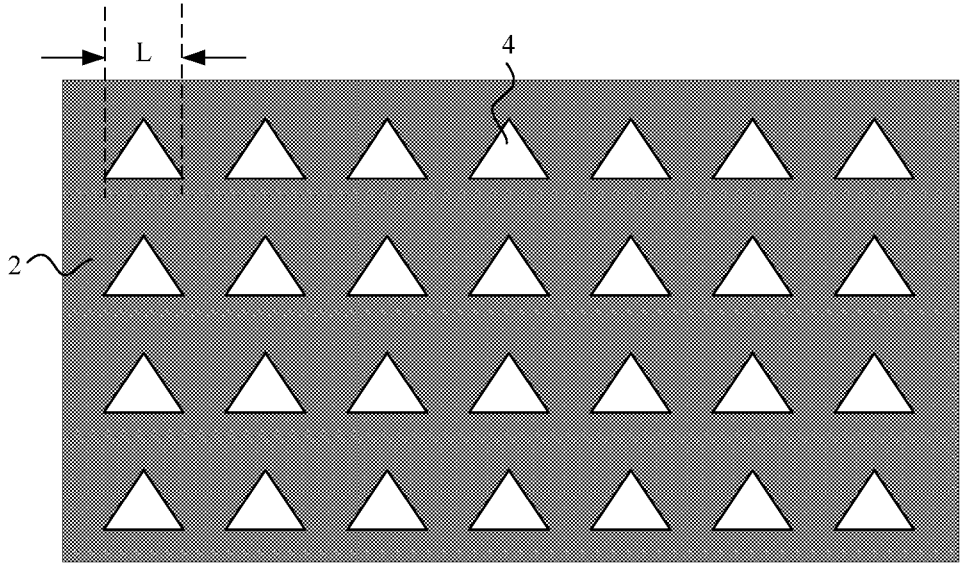
FIG. 22 is a schematic diagram of a planar structure of yet another glass layer according to an exemplary embodiment of the present disclosure.

FIG. 22 is a schematic diagram of a planar structure of yet another glass layer according to an exemplary embodiment of the present disclosure, showing the arrangement of equilateral triangular first structural holes in the glass layer in the folding area 2. As shown in FIG. 22, a plurality of first structural holes 4 may be arranged in an array form including a plurality of hole rows and a plurality of hole columns.

The hole rows may include a plurality of first structural holes sequentially arranged along the first direction X in an aligned manner, and the hole columns may include a plurality of first structural holes sequentially arranged along the second direction Y in an aligned manner. The side lengths L of the first structural holes 4 are the same.

Figure 23:
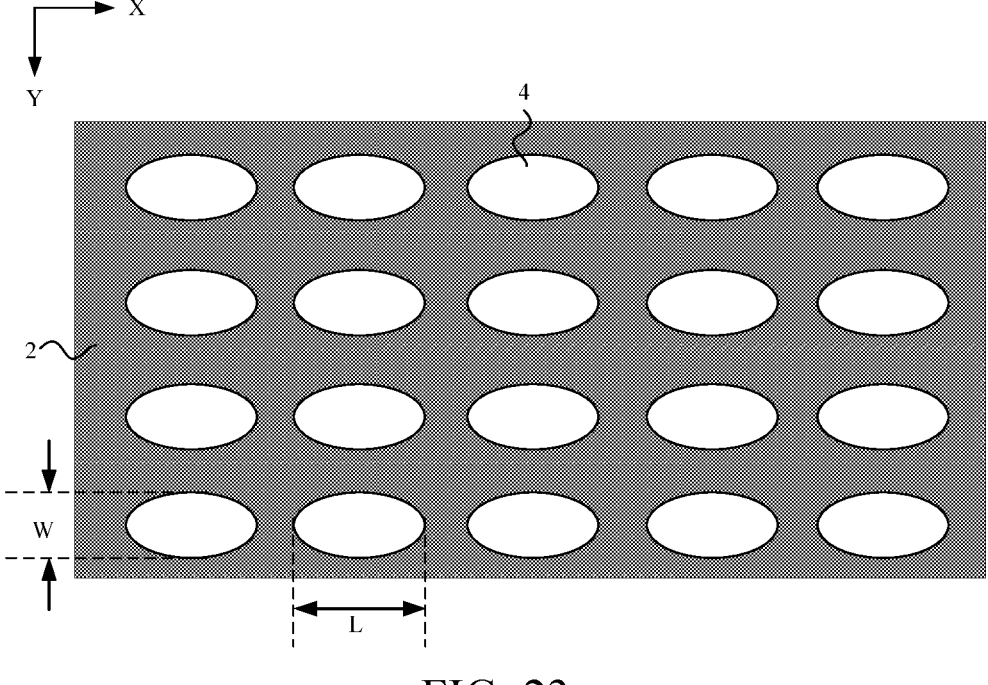
FIG. 23 is a schematic diagram of a planar structure of yet another glass layer according to an exemplary embodiment of the present disclosure.

FIG. 23 is a schematic diagram of a planar structure of yet another glass layer according to an exemplary embodiment of the present disclosure, showing the arrangement of elliptical first structural holes in the glass layer in the folding area 2. As shown in FIG. 23, the shape of the first structural hole 4 is elliptical, the major axis of the first structural hole 4 is parallel to the first direction X, and the minor axis of the first structural hole 4 is parallel to the second direction Y. The first structural hole 4 has a first dimension L and a second dimension W, the first dimension L is a dimension in the first direction X, i.e. the major axis dimension of the ellipse; the second dimension W is a dimension in the second direction Y, i.e. the minor axis dimension of the ellipse, and the first dimension L is larger than the second dimension W.

In an exemplary embodiment, the first dimension L may be in the range of 0.5 µm to 500 µm and the second dimension W may be in the range of 0.5 µm to 500 µm.

In an exemplary embodiment, the plurality of first structural holes 4 may be arranged in an array arrangement including a plurality of hole rows and a plurality of hole columns. The hole rows may include a plurality of first structural holes sequentially arranged along the first direction X in an aligned manner, and the hole columns may include a plurality of first structural holes sequentially arranged along the second direction Y in an aligned manner. Such uniformly arranged elliptical hole structure enables the display panel to be subjected uniform force upon being folded horizontally.

In an exemplary embodiment, the elliptical-shaped first structural holes in the folding area may be disposed such that two adjacent rows or columns of the first structural holes are alternately arranged.

In an exemplary embodiment, the elliptical-shaped first structural holes in the folding area may be disposed such two adjacent rows of first structural holes are arranged in an aligned manner, and the first hole column is disposed on the left edge of the folding area 2, and the n-th hole column is disposed on the right edge of the folding area 2.

In an exemplary embodiment, the elliptical first structural holes in the folding area may be disposed such that two adjacent rows or columns of first structural holes are alternately arranged, and the first hole column is disposed on the left edge of the folding area 2, and the n-th hole column is disposed on the right edge of the folding area 2.

Figure 24:
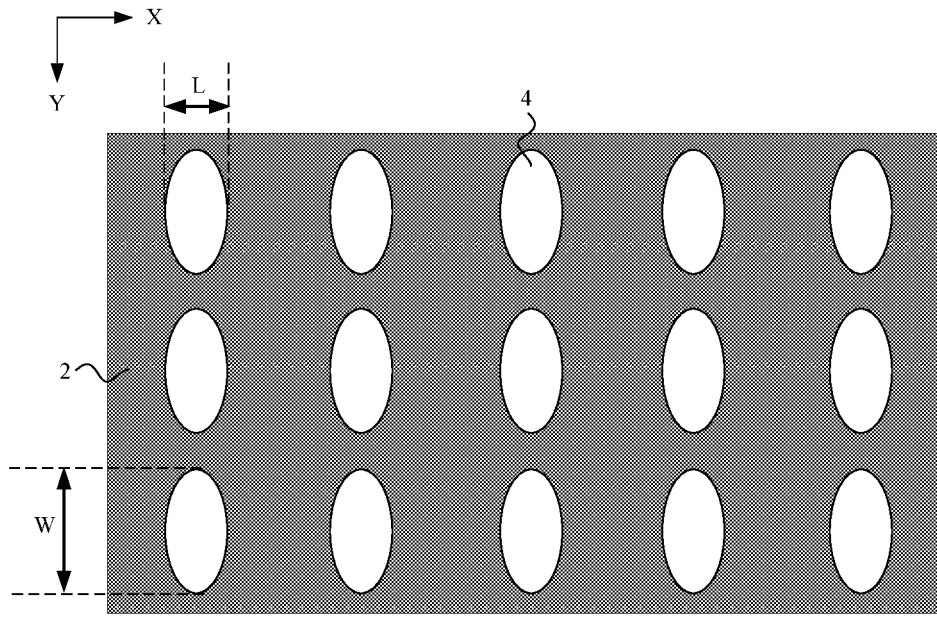
FIG. 24 is a schematic diagram of a planar structure of yet another glass layer according to an exemplary embodiment of the present disclosure.

FIG. 24 is a schematic diagram of a planar structure of yet another glass layer according to an exemplary embodiment of the present disclosure, showing the arrangement of elliptical first structural holes in the glass layer in the folding area 2. As shown in FIG. 24, the shape of the first structural hole 4 is elliptical, the minor axis of the first structural hole 4 is parallel to the first direction X, and the major axis of the first structural hole 4 is parallel to the second direction Y. The first structural hole 4 has a first dimension L which is a dimension in the first direction X and a second dimension W which is a dimension in the second direction Y, the first dimension L is less than the second dimension W.

Figure 25:
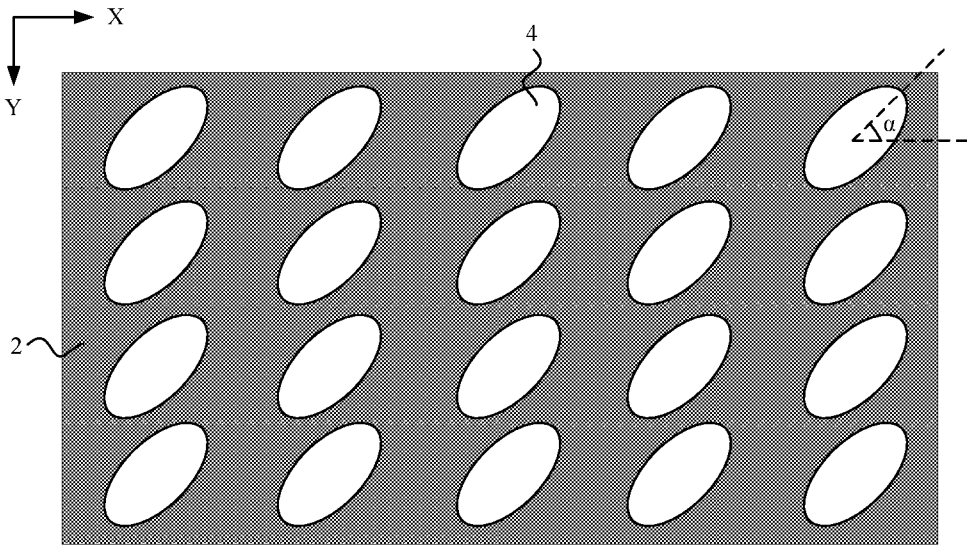
FIG. 25 is a schematic diagram of a planar structure of yet another glass layer according to an exemplary embodiment of the present disclosure.

FIG. 25 is a schematic diagram of a planar structure of yet another glass layer according to an exemplary embodiment of the present disclosure, showing the arrangement of elliptical first structural holes in the glass layer in the folding area 2. As shown in FIG. 25, in the folding area 2, the major axis of each ellipse in the first hole row to the n-th hole row is at an angle α to the first direction X, that is, the elliptical first structural holes are arranged obliquely. Such uniformly arranged elliptical hole structure enables the display panel to be subjected to uniform force in a specific direction (such as 45 degrees from the first direction X) when being folded.

Figure 26:
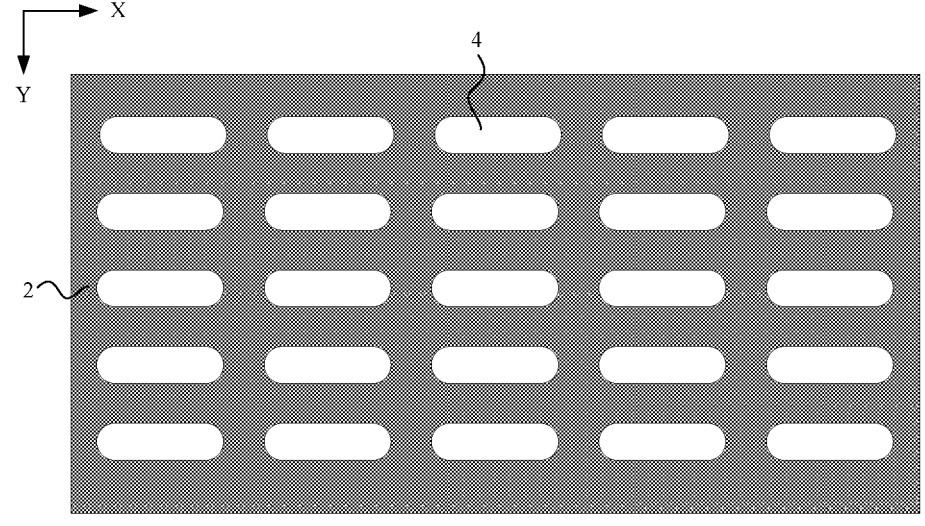
FIG. 26 is a schematic diagram of a planar structure of yet another glass layer according to an exemplary embodiment of the present disclosure.

FIG. 26 is a schematic diagram of a planar structure of yet another glass layer according to an exemplary embodiment of the present disclosure, showing the arrangement of stripe-shaped first structural holes with equal cross-sectional width in the glass layer in the folding area 2. As shown in FIG. 26, a plurality of first structural holes 4 may be arranged in an array form including a plurality of hole rows and a plurality of hole columns. The hole rows may include a plurality of first structural holes sequentially arranged along the first direction X in an aligned manner, and the hole columns may include a plurality of first structural holes sequentially arranged along the second direction Y in an aligned manner. The shape of the first structural hole 4 is a strip shape with equal cross-sectional width. The first structural hole 4 may extend along the first direction X, and the cross-sectional widths of the first structural holes 4 are the same, the cross-sectional width is a dimension in the second direction Y, and the first direction intersects with the second direction. Such uniformly arranged strip-shaped hole structure with equal cross-sectional width enables the display panel to be subjected to uniform force and obtain desired folding radius when being folded.

In an exemplary embodiment, the strip-shaped first structural holes 4 with equal cross-sectional width may extend along the second direction Y, the cross-sectional widths of the first structural holes 4 are the same, the cross-sectional width is a dimension in the first direction X; alternatively, the a strip-shaped first structural holes 4 with equal cross-sectional width may extend at a predefined included angle to the first direction X.

Figure 27:
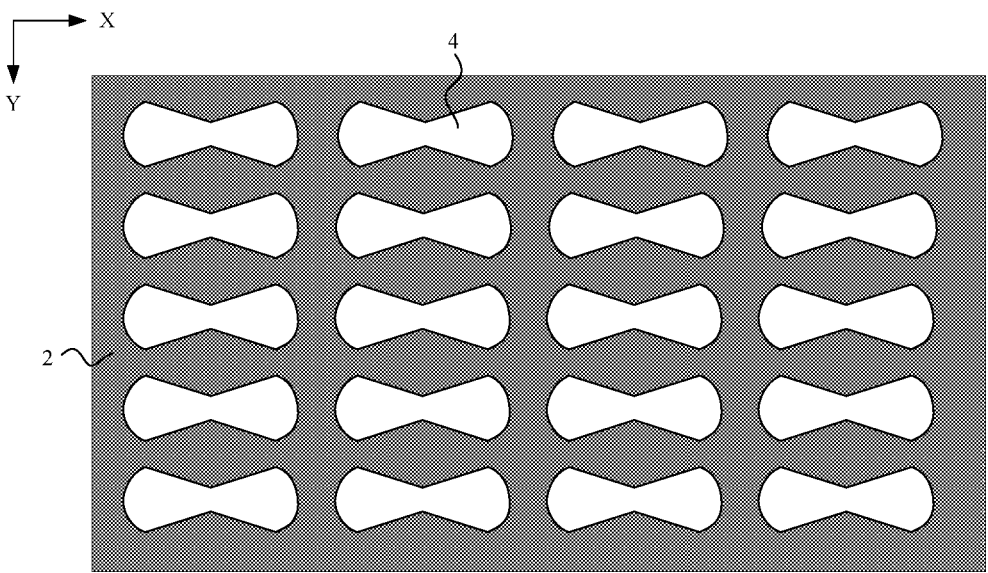
FIG. 27 is a schematic diagram of a planar structure of yet another glass layer according to an exemplary embodiment of the present disclosure.

FIG. 27 is a schematic diagram of a planar structure of yet another glass layer according to an exemplary embodiment of the present disclosure, showing the arrangement of stripe-shaped first structural holes with variable cross-sectional width in the glass layer in the folding area 2. As shown in FIG. 27, a plurality of first structural holes 4 may be arranged in an array form including a plurality of hole rows and a plurality of hole columns. The hole rows may include a plurality of first structural holes sequentially arranged along the first direction X in an aligned manner, and the hole columns may include a plurality of first structural holes sequentially arranged along the second direction Y in an aligned manner. The shape of the first structural hole 4 is a strip shape with variable cross-sectional width. The first structural hole 4 may extend along the first direction X, and the cross-sectional widths of the first structural holes 4 are the variable, the cross-sectional width is a dimension in the second direction Y, and the first direction intersects with the second direction. The width of the middle area of the first structural hole is narrow, and gradually increases with extending away from the middle area until the width of the two end areas is maximum, that is, the cross-sectional width of the middle area of the first structural hole is less than the cross-sectional width of the two end areas of the first structural hole. Such uniformly arranged strip-shaped first structural holes with variable widths enables the display panel to be subjected to uniform force and obtain desired folding radius when being folded.

In an exemplary embodiment, the strip-shaped first structural holes with variable cross-sectional width may extend along a second direction Y, the cross-sectional widths of the first structural holes 4 are variable, the cross-sectional width is a dimension in the first direction X; alternatively, the strip-shaped first structural holes with variable cross-section width can extend at a predefined included angle to the first direction X.

Figure 28:
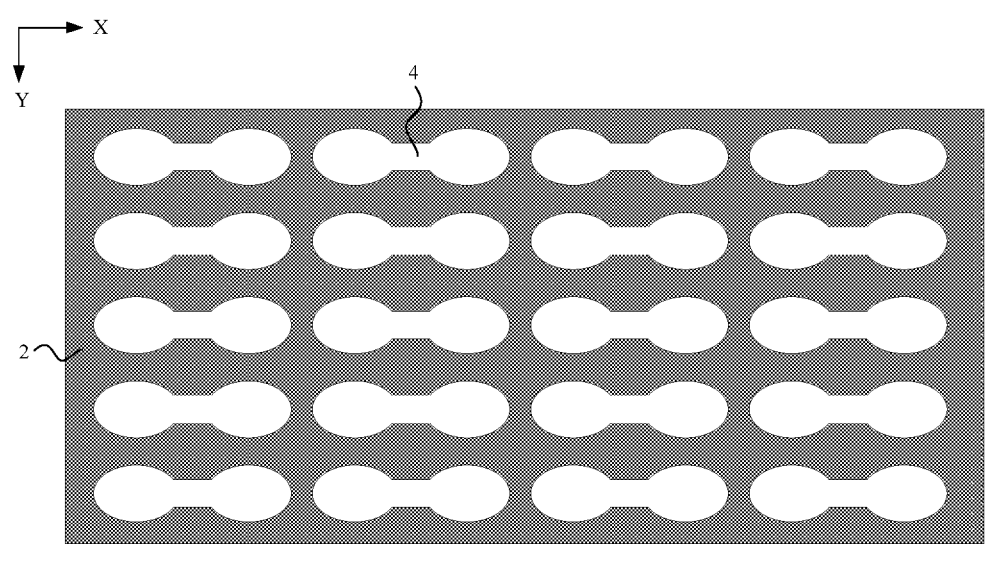
FIG. 28 is a schematic diagram of a planar structure of yet another glass layer according to an exemplary embodiment of the present disclosure.

FIG. 28 is a schematic diagram of a planar structure of yet another glass layer according to an exemplary embodiment of the present disclosure, showing the arrangement of stripe-shaped first structural holes with variable cross-sectional width in the glass layer in the folding area 2. As shown in FIG. 28 the shape of the first structural hole 4 is a strip shape with variable cross-sectional width including a combination of a rectangle and two circles. The first structural hole 4 may extend along the first direction X, and the cross-sectional widths of the first structural holes 4 are the variable, the cross-sectional width is a dimension in the second direction Y, and the first direction intersects with the second direction. The width of the middle area of the first structural hole is narrow, and gradually increases with extending away from the middle area until the width of the two end areas is maximum, that is, the cross-sectional width of the middle area of the first structural hole is less than the cross-sectional width of the two end areas of the first structural hole. Such uniformly arranged strip-shaped first structural holes with variable widths enables the display panel to be subjected to uniform force and obtain desired folding radius when being folded.

In an exemplary embodiment, the strip-shaped first structural holes with variable cross-sectional width may extend along a second direction Y, the cross-sectional widths of the first structural holes 4 are variable, the cross-sectional width is a dimension in the first direction X; alternatively, the strip-shaped first structural holes with variable cross-section width can extend at a predefined included angle to the first direction X.

In the folding area 2, the first structural holes of the glass layer may also have other shapes dimensions or arrangements which will not be described here.

The structure of the cover plate layer is described in detail through a preparation process of the cover plate layer.

Figure 29A:
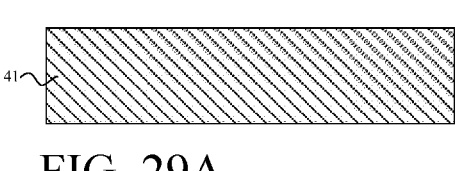
FIGS. 29A to 29H are schematic diagrams showing a preparation process of a cover plate layer according to an exemplary embodiment of the present disclosure.

FIGS. 29A to 29H are schematic diagrams showing a preparation process of a cover plate layer according to an exemplary embodiment of the present disclosure. In an exemplary embodiment, the preparation process of the cover plate layer may include the followings:

(1) Providing a glass substrate 41, wherein the glass substrate 41 may have a dimension of about 500 mm*500 mm and a thickness of about 300 μm, as shown in FIG. 29A.

Figure 29B:
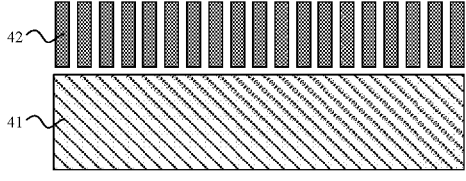

(2) Disposing a mask 42 on the glass substrate 41 and tightly attach the mask 42 to the glass substrate 41, as shown in FIG. 29B. In an exemplary embodiment, the mask 42 may adopt a patterned acid resistant film.

Figure 29C:
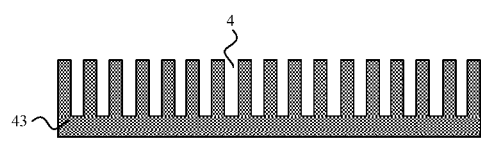

(3) Etching the glass substrate 41 to form a plurality of first structural holes 4 as structural holes on the glass substrate 41, that is, a glass layer 43 having a plurality of first structural holes is obtained, as shown in FIG. 29C. In an exemplary embodiment, the etching method may be a chemical etching method.

Figure 29D:
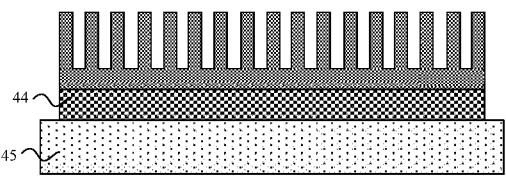

(4) Subsequently, attaching the glass layer 43 having the plurality of first structural holes to a platform 45 by means of an adhesive layer 44, as shown in FIG. 29D.

Figure 29E:
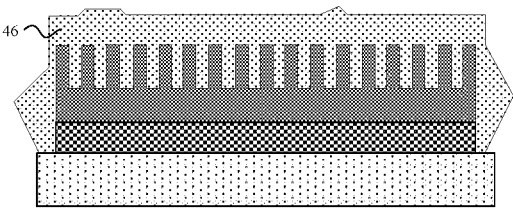

(5) Then, coating a curable organic polymer filler material 46 such that the filler material 46 fills the plurality of first structural holes, as shown in FIG. 29E.

Figure 29F:
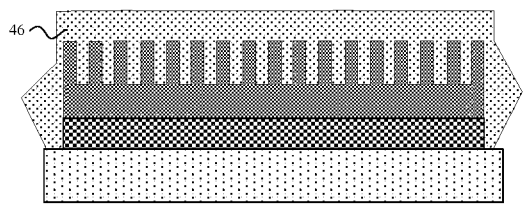

(6) Enabling an upper surface of the organic polymer filler material to be flush by a coating and flush process, and curing the organic polymer filler material by a curing process, as shown in FIG. 29F.

Figure 29G:
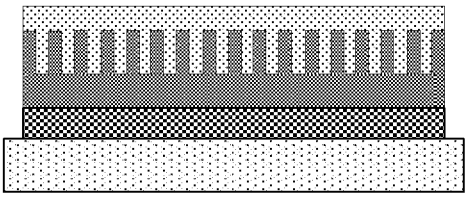

(7) Modifying the excess organic polymer filler material by glue overflow modification, as shown in FIG. 29G.

Figure 29H:

(8) Degumming to remove the glue layer to obtain a cover plate layer, as shown in FIG. 29H.

The second structural hole 5 may be formed in the glass substrate 41 by a similar chemical etching method. The first structural hole 4 and the second structural hole 5 are not communicated, and the sum of the depth of the first structural hole 4 and the depth of the second structural hole 5 is less than the thickness of the glass substrate 41.

For the cover plate layer formed with structural holes, it is also necessary to undergo later thinning and strengthening, and the desired cover plate layer can be obtained by adopting the conventional process flow in the art, including laser cutting, laminating, cutting, edge strengthening, unlaminating, chemical strengthening and surface strengthening, etc.

In exemplary embodiments, the acid mimic film may be a commercially available acid mimic film with its own pattern, or an acid mimic film with a desired pattern obtained by conventional processes in the art, including a yellow light process, coating PR glue, re-exposure, development, etching, etc.

In some possible exemplary embodiments, the first structural hole in the form of a through hole or a blind hole may be formed in the glass layer by laser drilling, which is not limited herein.

In some possible exemplary embodiments, the second structural hole may also be formed by laser drilling.

Figure 30:
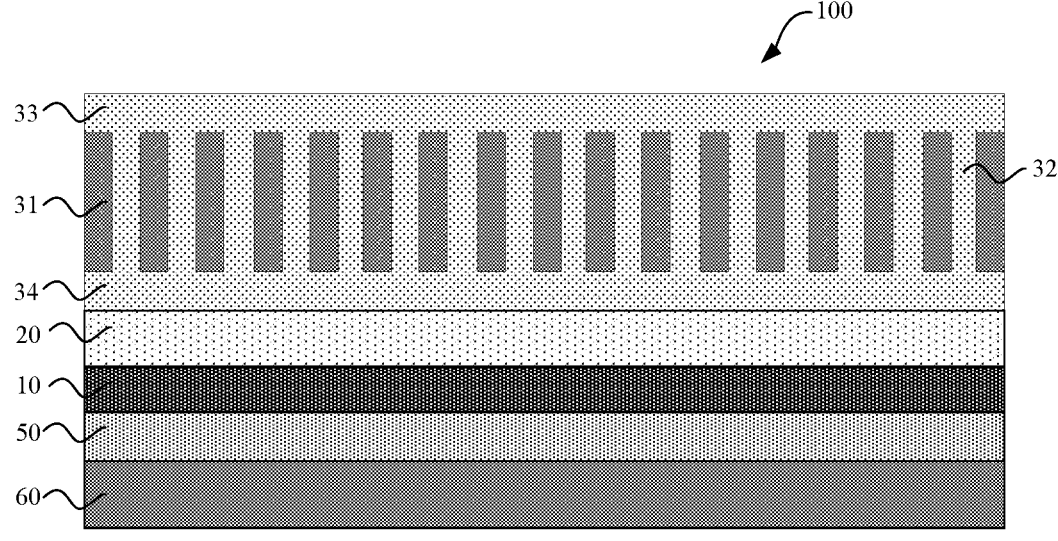
FIG. 30 is a schematic diagram of a cross-sectional structure of a folding area in another display panel according to an exemplary embodiment of the present disclosure.

FIG. 30 is a schematic diagram of a cross-sectional structure of a folding area in another display panel according to an exemplary embodiment of the present disclosure. As shown in FIG. 30, on a plane perpendicular to the display panel, the folding area 2 of the display panel 100 may at least include a display substrate 10, an adhesive layer 20 disposed on the display substrate 10, and a cover plate layer 30 disposed at a side of the adhesive layer 20 away from the display substrate 10.

In an exemplary embodiment, the folding area 2 of the display panel 100 may further include a back film layer 50 disposed at a side of the display substrate 10 away from the adhesive layer 20 and a support layer 60 disposed at a side of the back film layer 50 away from the display substrate 10.

The support layer 60 may be made of a steel sheet, a carbon fiber, or the like.

In an exemplary embodiment, the cover plate layer 30 may include a glass layer 31, a first filler layer 32, a first reinforcement layer 33 and a second reinforcement layer 34. The glass layer 31 is provided with a plurality of first structural holes, the first structural holes may be in the form of a through-hole structure, and the depth of the first structural holes is the same as the thickness of the glass layer 31. The first filler layer 32 fills a plurality of first structural holes. The first reinforcement layer 33 is disposed at a side of the glass layer 31 away from the display substrate 10 and the second reinforcement layer 34 is disposed at a side of the glass layer 31 close to the display substrate 10.

The cover plate layer according to an exemplary embodiment of the present disclosure may be directly used as a display cover plate as an outermost layer of a display panel, thereby enhancing the glass touch of a foldable display apparatus.

Figure 31:
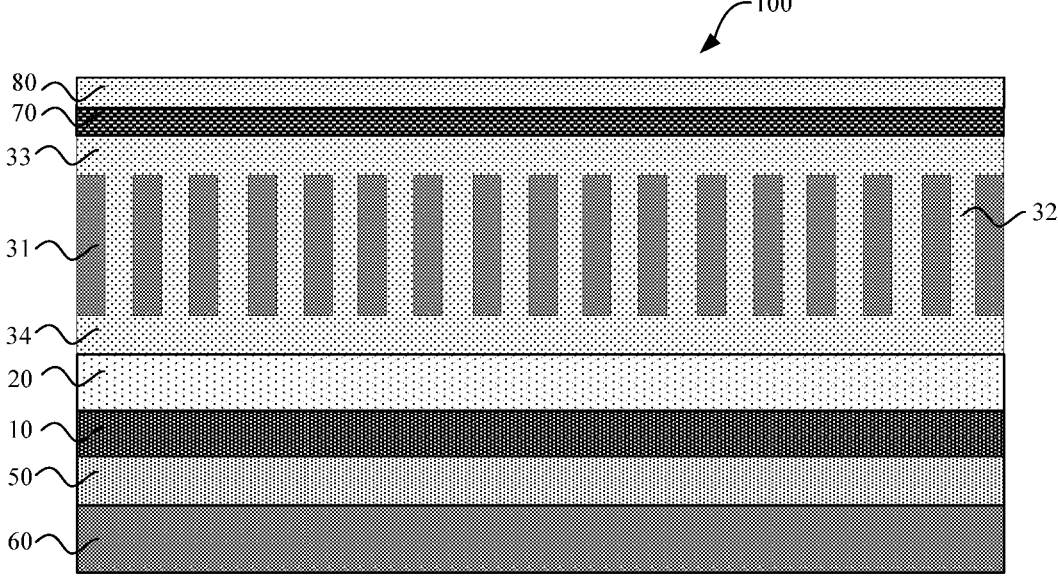
FIG. 31 is a schematic diagram of a cross-sectional structure of a folding area in yet another display panel according to an exemplary embodiment of the present disclosure.

FIG. 31 is a schematic diagram of a cross-sectional structure of a folding area in yet another display panel according to an exemplary embodiment of the present disclosure. As shown in FIG. 31, on a plane perpendicular to the display panel, the folding area 2 of the display panel 100 may further include a protective adhesive layer 70 disposed at a side of the cover plate layer 30 away from the display substrate 10 and a protective layer 80 disposed at a side of the protective adhesive layer 70 away from the display substrate 10.

The protective layer 80 may adopt polyimide (CPI) or polyethylene terephthalate (PET) material.

The protective adhesive layer 70 may be optically transparent adhesive (OCA) or optically transparent resin which may be thermosetting type optically transparent resin or ultraviolet curing type optically transparent resin.

Figure 32:
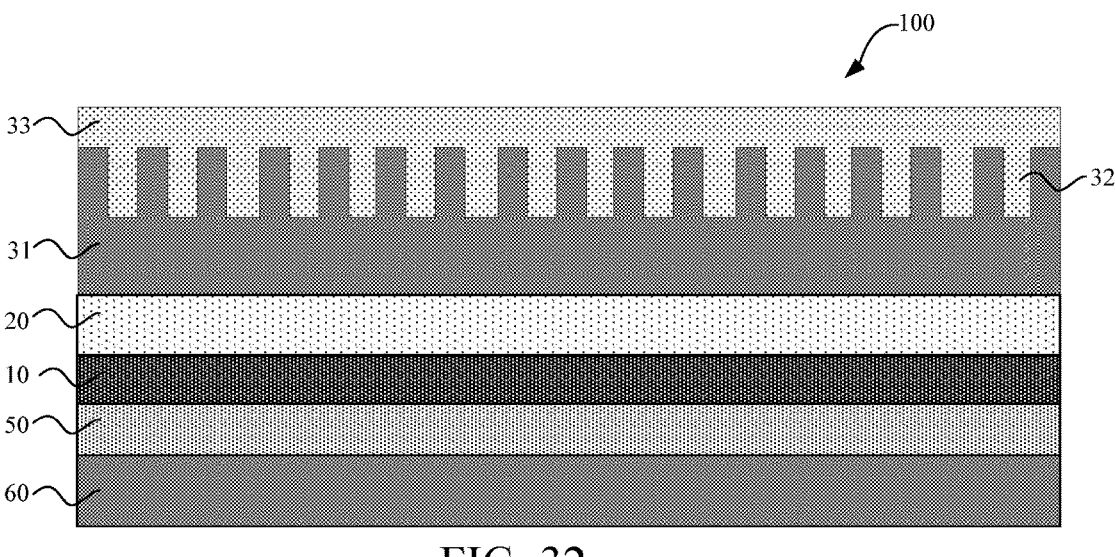
FIG. 32 is a schematic diagram of a cross-sectional structure of a folding area in yet another display panel according to an exemplary embodiment of the present disclosure.

FIG. 32 is a schematic diagram of a cross-sectional structure of a folding area in yet another display panel according to an exemplary embodiment of the present disclosure. As shown in FIG. 32, the folding area 2 of the display panel 100 may include a cover plate layer on a plane perpendicular to the display panel. The cover plate layer may include a glass layer 31, a first filler layer 32 and a first reinforcement layer 33. A plurality of first structural holes are disposed at a side of the glass layer 31 away from the display substrate 10, the first structural holes may be in the form of a blind hole structure, and the depth of the first structural holes is less than the thickness of the glass layer 31. The first filler layer 32 fills the first structural hole and the first reinforcement layer 33 is disposed at a side of the glass layer 31 away from the display substrate 10.

The cover plate layer according to an exemplary embodiment of the present disclosure may be directly used as a display cover plate as an outermost layer of a display panel, thereby enhancing the glass touch of a foldable display apparatus.

Figure 33:
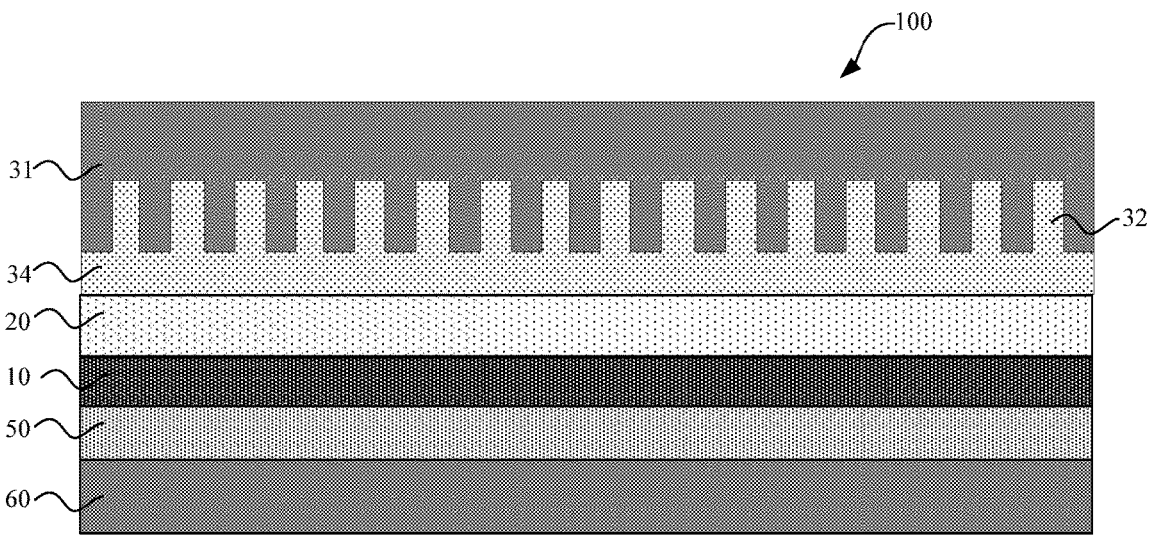
FIG. 33 is a schematic diagram of a cross-sectional structure of a folding area in yet another display panel according to an exemplary embodiment of the present disclosure.

FIG. 33 is a schematic diagram of a cross-sectional structure of a folding area in yet another display panel according to an exemplary embodiment of the present disclosure. As shown in FIG. 33, the folding area 2 of the display panel 100 may include a cover plate layer on a plane perpendicular to the display panel. The cover plate layer may include a glass layer 31, a first filler layer 32, and a second reinforcement layer 34. A plurality of first structural holes are disposed at a side of the glass layer 31 close to the display substrate 10, the first structural holes may be in the form of a blind hole structure, and the depth of the first structural holes is less than the thickness of the glass layer 31. The first filler layer 32 fills the first structural hole and the second reinforcement layer 34 is disposed at a side of the glass layer 31 close to the display substrate 10.

The cover plate layer according to an exemplary embodiment of the present disclosure may be directly used as a display cover plate as an outermost layer of a display panel, thereby enhancing the glass touch of a foldable display apparatus.

Figures 34, 35:
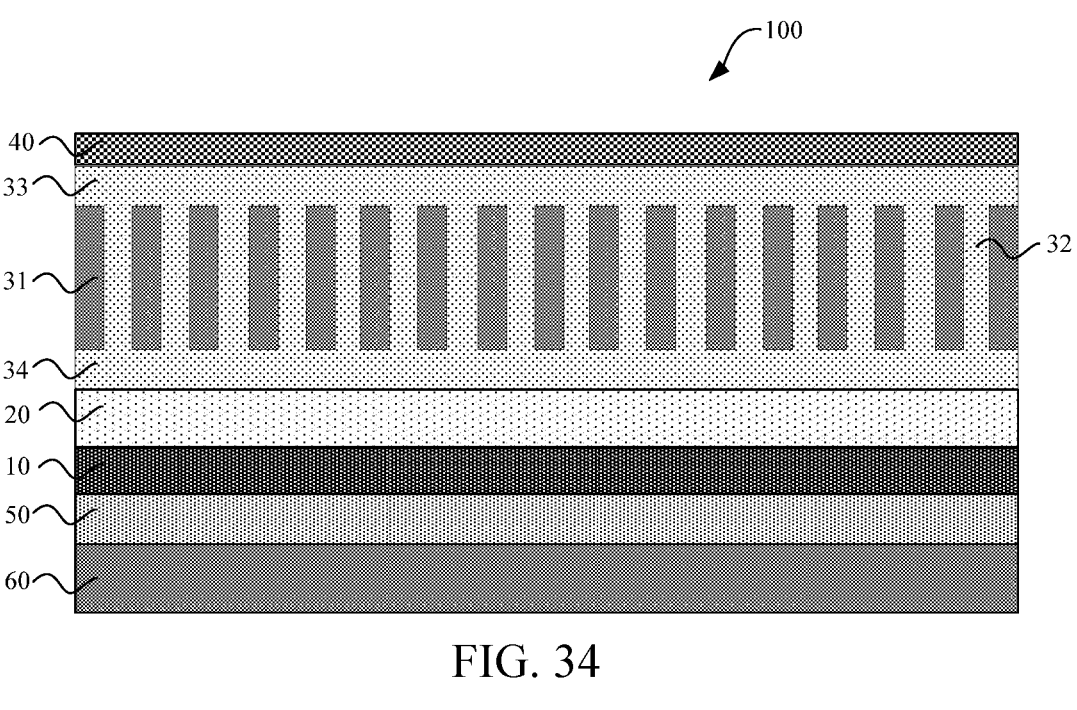
FIG. 34 is a schematic diagram of a cross-sectional structure of a folding area in yet another display panel according to an exemplary embodiment of the present disclosure.
FIG. 35 is a schematic diagram of a cross-sectional structure of a folding area in yet another display panel according to an exemplary embodiment of the present disclosure.

FIG. 34 is a schematic diagram of a cross-sectional structure of a folding area in yet another display panel according to an exemplary embodiment of the present disclosure. As shown in FIG. 34, on a plane perpendicular to the display panel, the folding area 2 of the display panel 100 may further include a functional layer 40 disposed at a side of the first reinforcement layer 33 away from the display substrate 10.

In an exemplary embodiment, the functional layer 40 may include a hard coating and an anti-fingerprint layer (AF). In an exemplary embodiment, the hardness of the hard coating is between 4H and 6H. Alternatively, the material used for the hard coating may be a transparent inorganic substance or a siloxane.

FIG. 35 is a schematic diagram of a cross-sectional structure of a folding area in yet another display panel according to an exemplary embodiment of the present disclosure. As shown in FIG. 35, the folding area 2 of the display panel 100 may include a cover plate layer on a plane perpendicular to the display panel. The cover plate layer may include a glass layer 31 a first filler layer, 32 a second reinforcement layer 34 and a second filler layer 35. At least one second structural hole is disposed at a side of the glass layer 31 close to the display substrate 10. In an area corresponding to the first length of the second structural holes, a plurality of first structural holes are disposed at a side of the glass layer 31 away from the display substrate 10, the first structural holes are not communicated with the second structural holes. The sum of the depth of the first structural hole and the depth of the second structural hole is less than the thickness of the glass layer 31. The first filler layer 32 fills the first structural holes. The second filler layer 35 fills the second structural hole. The second reinforcement layer 34 is disposed at a side of the glass layer 31 close to the display substrate 10.

The cover plate layer according to an exemplary embodiment of the present disclosure may be directly used as a display cover plate as an outermost layer of a display panel, thereby enhancing the glass touch of a foldable display apparatus.

In some possible exemplary embodiments, the folding area 2 of the display panel 100 may also include a protective adhesive layer 70 disposed at a side of the cover plate layer 30 away from the display substrate 10 and a protective layer 80 disposed at a side of the protective adhesive layer 70 away from the display substrate 10.

Figure 36:
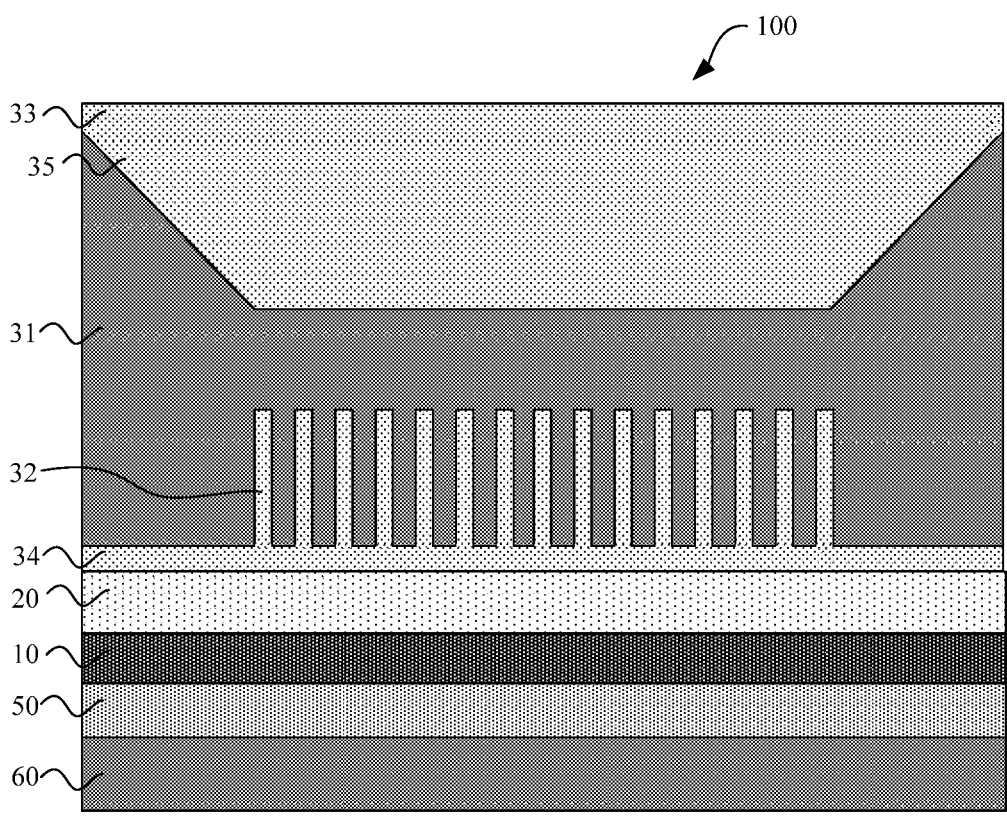
FIG. 36 is a schematic diagram of a cross-sectional structure of a folding area in yet another display panel according to an exemplary embodiment of the present disclosure.

FIG. 36 is a schematic diagram of a cross-sectional structure of a folding area in yet another display panel according to an exemplary embodiment of the present disclosure. As shown in FIG. 36, the folding area 2 of the display panel 100 may include a cover plate layer on a plane perpendicular to the display panel. The cover plate layer may include a glass layer 31, a first filler layer 32, a first reinforcement layer 33, a second reinforcement layer 34 and a second filler layer 35. At least one second structural hole is disposed at a side of the glass layer 31 away from the display substrate 10. In an area corresponding to a shorter edge of the second structural hole having an inverted trapezoidal shape in cross section, a plurality of first structural holes are disposed at a side of the glass layer 31 close to the display substrate 10, the first structural holes and the second structural hole are not communicated. The sum of the depth of the first structural hole and the depth of the second structural hole is less than the thickness of the glass layer 31. The first filler layer 32 fills the first structural holes. The second filler layer 35 fills the second structural hole. The first reinforcement layer 33 is disposed at a side of the glass layer 31 away from the display substrate 10. The second reinforcement layer 34 is disposed at a side of the glass layer 31 close to the display substrate 10.

The cover plate layer according to an exemplary embodiment of the present disclosure may be directly used as a display cover plate as an outermost layer of a display panel, thereby enhancing the glass touch of a foldable display apparatus.

In some possible exemplary embodiments, the folding area 2 of the display panel 100 may also include a protective adhesive layer 70 disposed at a side of the cover plate layer 30 away from the display substrate 10 and a protective layer 80 disposed at a side of the protective adhesive layer 70 away from the display substrate 10.

Exemplary embodiments of the present disclosure provide a display panel, by adopting a glass layer with a thickness of 50 μm to 500 μm, the glass layer is provided with the first structural hole and/or the second structural hole, which not only effectively improves the mechanical performance of the glass layer, has good impact resistance and does not break during use, but also effectively improves the bending performance of the glass layer, and the display panel is subjected to uniform force when being folded, thus realizing balanced improvement of the mechanical performance and the bending performance. By disposing the filler layer and the reinforcement layer in the cover plate layer, the cover plate layer can be directly used as the display cover as the outermost layer of the display panel, thereby enhancing the glass touch of the foldable display device. The mechanical performance tests such as falling pen, dropping ball, creasing and pointed extrusion show that the display panel fully meets the relevant requirements and standards.

The display panel according to the exemplary embodiments of the present disclosure may also include various combinations and arrangements of various perforated glass layers and other components of the display panel according to the exemplary embodiments of the present disclosure, which will not be repeated herein.

Exemplary embodiments of the present disclosure further provide a display apparatus, including any one of the above display panels. The display apparatus may be any product or component with a display function, such as a mobile phone, a tablet computer, a television, a display, a laptop computer, a digital photo frame, and a navigator.

Although the embodiments disclosed in the present disclosure are as above, the described contents are only embodiments used for convenience of understanding the present disclosure and are not intended to limit the present disclosure. Any person skilled in the art to which the present disclosure pertains may make any modification and variation in implementation forms and details without departing from the spirit and scope disclosed in the present disclosure. However, the scope of patent protection of the present disclosure is still subject to the scope defined by the appended claims.

The invention claimed is:

1. A display panel, comprising a folding area and a non-folding area located at least one side of the folding area, wherein on a plane perpendicular to the display panel, the display panel at least comprises a display substrate, an adhesive layer disposed on the display substrate and a cover plate layer disposed at a side of the adhesive layer away from the display substrate, the cover plate layer comprises at least a glass layer provided with at least one structural hole at a position corresponding to the folding area, and the glass layer has a thickness of 50 to 500 μm, wherein the structural hole comprises a first structural hole disposed at a side of the glass layer close to the display substrate, a depth of the first structural hole is less than a thickness of the glass layer, wherein the cover plate layer further comprises a first filler layer that fills the first structural hole, and wherein the cover plate layer further comprises a first reinforcement layer disposed at a side of the glass layer close to the display substrate.

2. The display panel according to claim 1, wherein materials of the first filler layer and the first reinforcement layer comprise an inorganic transparent material or an organic polymer material.

3. The display panel according to claim 1, wherein a thickness of the first reinforcement layer is 20% to 50% of the thickness of the glass layer.

4. The display panel according to claim 1, wherein a ratio of the depth of the first structural hole to the thickness of the glass layer is greater than or equal to ½.

5. A display panel, comprising a folding area and a non-folding area located at least one side of the folding area, wherein on a plane perpendicular to the display panel, the display panel at least comprises a display substrate, an adhesive layer disposed on the display substrate and a cover plate layer disposed at a side of the adhesive layer away from the display substrate, the cover plate layer comprises at least a glass layer provided with at least one structural hole at a position corresponding to the folding area, and the glass layer has a thickness of 50 to 500 μm, wherein the structural hole comprises a second structural hole disposed at a side of the glass layer close to the display substrate, a depth of the second structural hole is less than the thickness of the glass layer; and/or a cross section of the second structural hole is in a trapezoidal or inverted trapezoidal shape.

6. A display panel, comprising a folding area and a non-folding area located at least one side of the folding area, wherein on a plane perpendicular to the display panel, the display panel at least comprises a display substrate, an adhesive layer disposed on the display substrate and a cover plate layer disposed at a side of the adhesive layer away from the display substrate, the cover plate layer comprises at least a glass layer provided with at least one structural hole at a position corresponding to the folding area, and the glass layer has a thickness of 50 to 500 μm, wherein the structural hole comprises first structural holes and a second structural hole, the first structural holes are disposed at a side of the glass layer away from the display substrate, and the second structural hole is disposed at a side of the glass layer close to the display substrate, and a sum of a depth of the first structural holes and a depth of the second structural hole is less than or equal to the thickness of the glass layer.

7. The display panel according to claim 6, wherein an orthographic projection of the first structural holes on the display substrate is at least partially overlapped with an orthographic projection of the second structural hole on the display substrate.

8. The display panel according to claim 6, wherein the cover plate layer further comprises a first filler layer that fills the first structural holes and a second filler layer that fills the second structural hole.

9. The display panel according to claim 8, wherein the cover plate layer further comprises at least one of a first reinforcement layer disposed at a side of the glass layer away from the display substrate and a second reinforcement layer disposed at a side of the glass layer close to the display substrate.

10. The display panel according to claim 9, wherein the first filler layer, the first reinforcement layer, the second reinforcement layer, and the second filler layer are made of the same or different materials; or the materials of the first filler layer, the first reinforcement layer, the second reinforcement layer, and the second filler layer comprises an inorganic transparent material or an organic polymer material.

11. The display panel according to claim 6, wherein on a plane parallel to the display substrate, a shape of the first structural holes comprises any one or more of the following: triangle, square, rectangle, pentagon, hexagon, polygon, circle and ellipse.

12. The display panel according to claim 11, wherein the shape of the first structural holes is a strip shape extending along a first direction, cross-sectional widths of the first structural holes are the same or different, and the cross-sectional widths are dimensions in a second direction, the first direction intersects with the second direction.

13. A display apparatus, comprising the display panel according to claim 1.

14. The display panel according to claim 12, wherein, along the first direction, a cross-sectional width of a middle area of the first structural holes is less than a cross-sectional width of two end areas of the first structural holes.

15. The display panel according to claim 1, wherein on a plane parallel to the display substrate, a shape of the first structural hole comprises any one or more of the following: triangle, square, rectangle, pentagon, hexagon, polygon, circle and ellipse.

16. The display panel according to claim 15, wherein the shape of the first structural hole is a strip shape extending along a first direction, cross-sectional widths of the first structural hole are the same or different, and the cross-sectional widths are dimensions in a second direction, the first direction intersects with the second direction.

17. The display panel according to claim 16, wherein, along the first direction, a cross-sectional width of a middle area of the first structural hole is less than a cross-sectional width of two end areas of the first structural hole.

* * * * *